US012796548B2

(12) United States Patent
Nam et al.

(10) Patent No.: US 12,796,548 B2
(45) Date of Patent: Nov. 10, 2026

(54) NON-VOLATILE MEMORY DEVICE

(71) Applicant: SAMSUNG ELECTRONICS CO., LTD., Suwon-si (KR)

(72) Inventors: Hanmin Nam, Suwon-si (KR); Jeunghwan Park, Suwon-si (KR); Pansuk Kwak, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 427 days.

(21) Appl. No.: 18/240,041

(22) Filed: Aug. 30, 2023

(65) Prior Publication Data

US 2024/0222322 A1 Jul. 4, 2024

(30) Foreign Application Priority Data

Dec. 28, 2022 (KR) ........................ 10-2022-0187760

(51) Int. Cl.

| | |
|---|---|
| ***H10W 90/00*** | (2026.01) |
| ***G11C 5/06*** | (2006.01) |
| ***H10B 41/27*** | (2023.01) |
| ***H10B 41/41*** | (2023.01) |
| ***H10B 43/27*** | (2023.01) |
| ***H10B 43/40*** | (2023.01) |
| ***H10B 80/00*** | (2026.01) |

(Continued)

(52) U.S. Cl.

CPC ............. *H10W 90/00* (2026.01); *G11C 5/063* (2013.01); *H10B 41/27* (2023.02); *H10B 41/41* (2023.02); *H10B 43/27* (2023.02); *H10B 43/40* (2023.02); *H10B 80/00* (2023.02); *H10W 72/9445* (2026.01); *H10W 80/312* (2026.01); *H10W 80/327* (2026.01); *H10W 80/743* (2026.01); *H10W 90/792* (2026.01)

(58) Field of Classification Search

CPC ............. H10W 90/00; H10W 72/9445; H10W 80/312; H10W 80/327; H10W 80/743; H10W 90/792; G11C 5/063; H10B 41/27; H10B 41/41; H10B 43/27; H10B 43/40; H10B 80/00

See application file for complete search history.

(56) References Cited

U.S. PATENT DOCUMENTS

| | | | |
|---|---|---|---|
| 11,133,297 | B2 | 9/2021 | Kim et al. |
| 11,176,989 | B2 | 11/2021 | Oh |

(Continued)

*Primary Examiner* — Jay C Kim
*Assistant Examiner* — Woo K Lee
(74) *Attorney, Agent, or Firm* — Sughrue Mion, PLLC

(57) ABSTRACT

A non-volatile memory device includes: a memory cell region including: a plurality of bit lines each extending in a first direction; and a plurality of upper bonding pads; and a peripheral circuit region including: a page buffer circuit; a plurality of lower bonding pads provided above the page buffer circuit and each connected to a respective one of the plurality of upper bonding pads; and a plurality of through-wiring lines each extending in the first direction. The plurality of lower bonding pads includes: first lower bonding pads, which are provided in a first line extending in the first direction; and second lower bonding pads, which are provided in a second line extending in the first direction. The plurality of through-wiring lines includes at least one first through-wiring line extending between the first line and the second line and extending across the page buffer circuit.

20 Claims, 31 Drawing Sheets

(51) Int. Cl.

| | |
|---|---|
| ***H10W 72/90*** | (2026.01) |
| ***H10W 80/00*** | (2026.01) |

(56) References Cited

U.S. PATENT DOCUMENTS

| | | | | |
|---|---|---|---|---|
| 11,195,587 | B2 | 12/2021 | Son et al. | |
| 11,315,639 | B2 | 4/2022 | Oh et al. | |
| 11,410,951 | B2 | 8/2022 | Choi et al. | |
| 2020/0395341 | A1 | 12/2020 | Maejima et al. | |
| 2021/0343669 | A1* | 11/2021 | Jung | H10W 72/019 |
| 2022/0122932 | A1* | 4/2022 | Oh | G11C 16/08 |
| 2022/0157754 | A1 | 5/2022 | Park et al. | |

* cited by examiner

NON-VOLATILE MEMORY DEVICE

CROSS-REFERENCE TO RELATED APPLICATION

This application is based on and claims priority under 35 U.S.C. § 119 to Korean Patent Application No. 10-2022-0187760, filed on Dec. 28, 2022, in the Korean Intellectual Property Office, the disclosure of which is incorporated by reference herein in its entirety.

BACKGROUND

The present disclosure relates to a memory device, and more particularly, to a three-dimensional non-volatile memory device in which a memory cell array is arranged in a vertical direction with respect to a peripheral circuit.

Due to the demand for increasing capacity and reducing size of non-volatile memory devices, three-dimensional non-volatile memory devices, in which memory cell arrays and peripheral circuits are arranged in vertical directions with respect to each other, have been developed. Along with the advance of semiconductor processes, the area of memory cell arrays decrease with the increasing number of stacked word lines in memory cell arrays. When memory cell arrays formed on first wafers are connected with peripheral circuits formed on second wafers in a bonding manner, the areas of peripheral circuits also decrease. However, the complexity of wiring in peripheral circuits increases and the cost of wiring processes also increases.

SUMMARY

One or more example embodiments provide a non-volatile memory device allowing a through-wiring line to be efficiently provided in a peripheral circuit region.

According to an aspect of an example embodiment, a non-volatile memory device includes: a memory cell region including: a plurality of bit lines each extending in a first direction; and a plurality of upper bonding pads each connected to a respective one of the plurality of bit lines; and a peripheral circuit region including: a page buffer circuit; a plurality of lower bonding pads provided above the page buffer circuit and each connected to a respective one of the plurality of upper bonding pads; and a plurality of through-wiring lines each extending in the first direction, wherein the plurality of lower bonding pads includes: first lower bonding pads, which are included in a first bonding pad group, and which are provided in a first line extending in the first direction; and second lower bonding pads, which are included in a second bonding pad group, and which are provided in a second line extending in the first direction, and wherein the plurality of through-wiring lines includes at least one first through-wiring line extending between the first line and the second line and extending across the page buffer circuit.

According to an aspect of an example embodiment, a non-volatile memory device includes: a first memory cell region including: a first memory cell array provided in a first wafer; bit lines connected to the first memory cell array and each extending in a first direction; and upper bonding pads each connected to a respective one of the bit lines; a second memory cell region including a second memory cell array provided in a second wafer, the second memory cell region being above the first memory cell region in a vertical direction; and a peripheral circuit region including: a page buffer circuit provided in a third wafer; lower bonding pads each connected to a respective one of the upper bonding pads; and a plurality of through-wiring lines each extending in the first direction, wherein the peripheral circuit region is under the first memory cell region in the vertical direction, wherein the lower bonding pads comprise: first lower bonding pads, which are included in a first bonding pad group and which are provided in a first line extending in the first direction; and second lower bonding pads, which are included in a second bonding pad group, and which are provided in a second line extending in the first direction, and wherein the plurality of through-wiring lines includes at least one first through-wiring line extending between the first line and the second line and extending across the page buffer circuit.

According to an aspect of an example embodiment, a non-volatile memory device includes: a memory cell region including: a plurality of bit lines each extending in a first direction; and a plurality of upper bonding pads each connected to a respective one of the plurality of bit lines; and a peripheral circuit region including: a page buffer circuit; a plurality of bonding pad groups provided above the page buffer circuit and each spaced apart from each other in a second direction; and a plurality of through-wiring lines each extending in the first direction to cross the page buffer circuit, wherein the peripheral circuit region is bonded to the memory cell region, wherein each of the plurality of bonding pad groups includes lower bonding pads provided in a first line extending in the first direction, and wherein the plurality of bonding pad groups and the plurality of through-wiring lines are alternately provided.

BRIEF DESCRIPTION OF THE DRAWINGS

The above and other aspects and features will be more apparent from the following description of example embodiments taken in conjunction with the accompanying drawings, in which.

DETAILED DESCRIPTION

Figure 1:
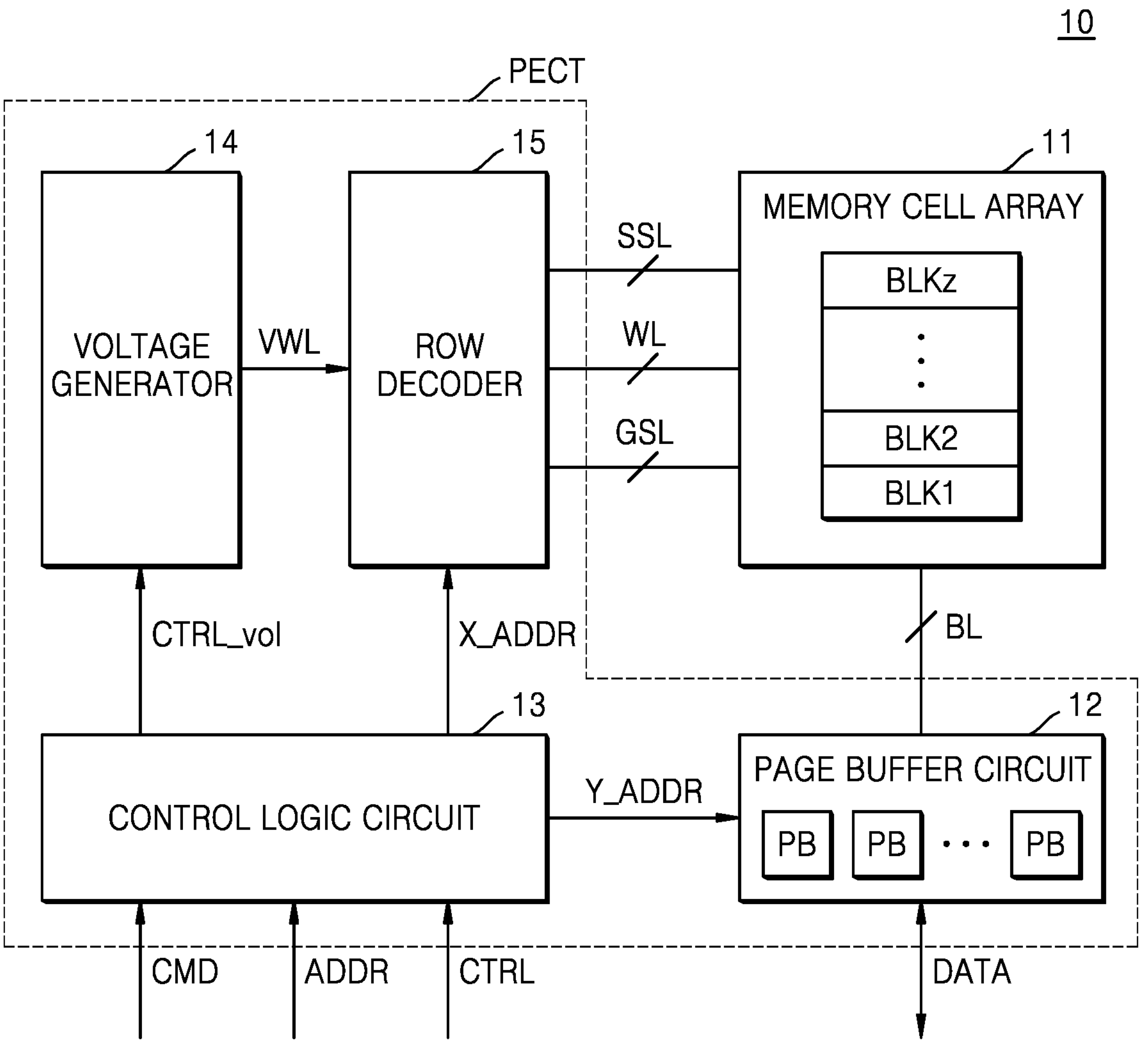
FIG. 1 is a block diagram illustrating a memory device according to one or more example embodiments.

Hereinafter, example embodiments will be described in detail with reference to the accompanying drawings. The same reference numerals are used for the same components in the drawings, and duplicate descriptions thereof are omitted.

FIG. 1 is a block diagram illustrating a memory device 10 according to one or more example embodiments.

Referring to FIG. 1, the memory device 10 may include a memory cell array 11 and a peripheral circuit PECT, and the peripheral circuit PECT may include a page buffer circuit 12, a control logic circuit 13, a voltage generator 14, and a row decoder 15. The peripheral circuit PECT may further include a data input/output circuit, an input/output interface, or the like. In addition, the peripheral circuit PECT may further include a temperature sensor, a command decoder, an address decoder, or the like. According to one or more example embodiments, the memory device 10 may refer to a non-volatile memory device.

The memory cell array 11 may include a plurality of memory blocks BLK1 to BLKz (where z is a positive integer), and each of the plurality of memory blocks BLK1 to BLKz may include a plurality of memory cells. The memory cell array 11 may be connected to the page buffer circuit 12 via bit lines BL and may be connected to the row decoder 15 via word lines WL, string select lines SSL, and ground select lines GSL. For example, the memory cells may include flash memory cells. Hereinafter, one or more example embodiments are described by taking examples in which the memory cells include NAND flash memory cells. However, one or more example embodiments are not limited thereto, and in one or more example embodiments, the memory cells may include resistive memory cells, such as resistive random access memory (ReRAM), phase-change RAM (PRAM), or magnetic RAM (MRAM).

In one or more example embodiments, the memory cell array 11 may include a three-dimensional memory cell array, and the three-dimensional memory cell array may include a plurality of NAND strings. In addition, each of the plurality of NAND strings may include memory cells respectively connected to word lines, which are vertically stacked on a substrate, and this is described in detail with reference to FIG. 2. Appropriate configurations for a three-dimensional memory array, which includes a plurality of levels, and in which word lines and/or bit lines are shared between the levels, are described in U.S. Pat. Nos. 7,679,133, 8,553,466, 8,654,587, 8,559,235, and U.S.

Patent Application Publication No. 2011/0233648, the disclosures of which are incorporated by reference in their entirety. However, one or more example embodiments are not limited thereto, and in one or more example embodiments, the memory cell array 11 may include a two-dimensional memory cell array, and the 2-dimensional memory cell array may include a plurality of NAND strings arranged in row and column directions.

The page buffer circuit 12 may include a plurality of page buffers PB. Each of the plurality of page buffers PB may be connected with the memory cells of the memory cell array 11 via a bit line corresponding thereto. The page buffer circuit 12 may select at least one of the bit lines BL according to control by the control logic circuit 13. For example, the page buffer circuit 12 may select some of the bit lines BL in response to a column address Y_ADDR received from the control logic circuit 13. Each of the plurality of page buffers PB may operate as a write driver or a sense amplifier. For example, in a program operation, each of the plurality of page buffers PB may store data DATA in a memory cell by applying, to a bit line, a voltage corresponding to the data DATA to be programmed. For example, in a program-verify operation or a read operation, each of the plurality of page buffers PB may sense the programmed data DATA by sensing a current or a voltage through a bit line.

The control logic circuit 13 may output various control signals, for example, a voltage control signal CTRL_vol, a row address X_ADDR, and a column address Y_ADDR, for programming data into the memory cell array 11, reading data from the memory cell array 11, or erasing data stored in the memory cell array 11, based on a command CMD, an address ADDR, and a control signal CTRL. Thus, the control logic circuit 13 may take overall control of various operations in the memory device 10. For example, the control logic circuit 13 may receive the command CMD, the address ADDR, and the control signal CTRL from a memory controller.

The voltage generator 14 may generate various voltages for performing program, read, and erase operations on the memory cell array 11, based on the voltage control signal CTRL_vol. Specifically, the voltage generator 14 may generate a word line voltage VWL, for example, a program voltage, a read voltage, a pass voltage, an erase-verify voltage, a program-verify voltage, or the like. In addition, the voltage generator 14 may further generate a string select line voltage and a ground select line voltage, based on the voltage control signal CTRL_vol.

The row decoder 15 may select one of the plurality of memory blocks BLK1 to BLKz, may select one of the word lines WL of the selected memory block, and may select one of the string select lines SSL, in response to the row address X_ADDR received from the control logic circuit 13. For example, the row decoder 15, during a program operation, may apply a program voltage and a program-verify voltage to the selected word line, and during a read operation, may apply a read voltage to the selected word line.

Figure 3:
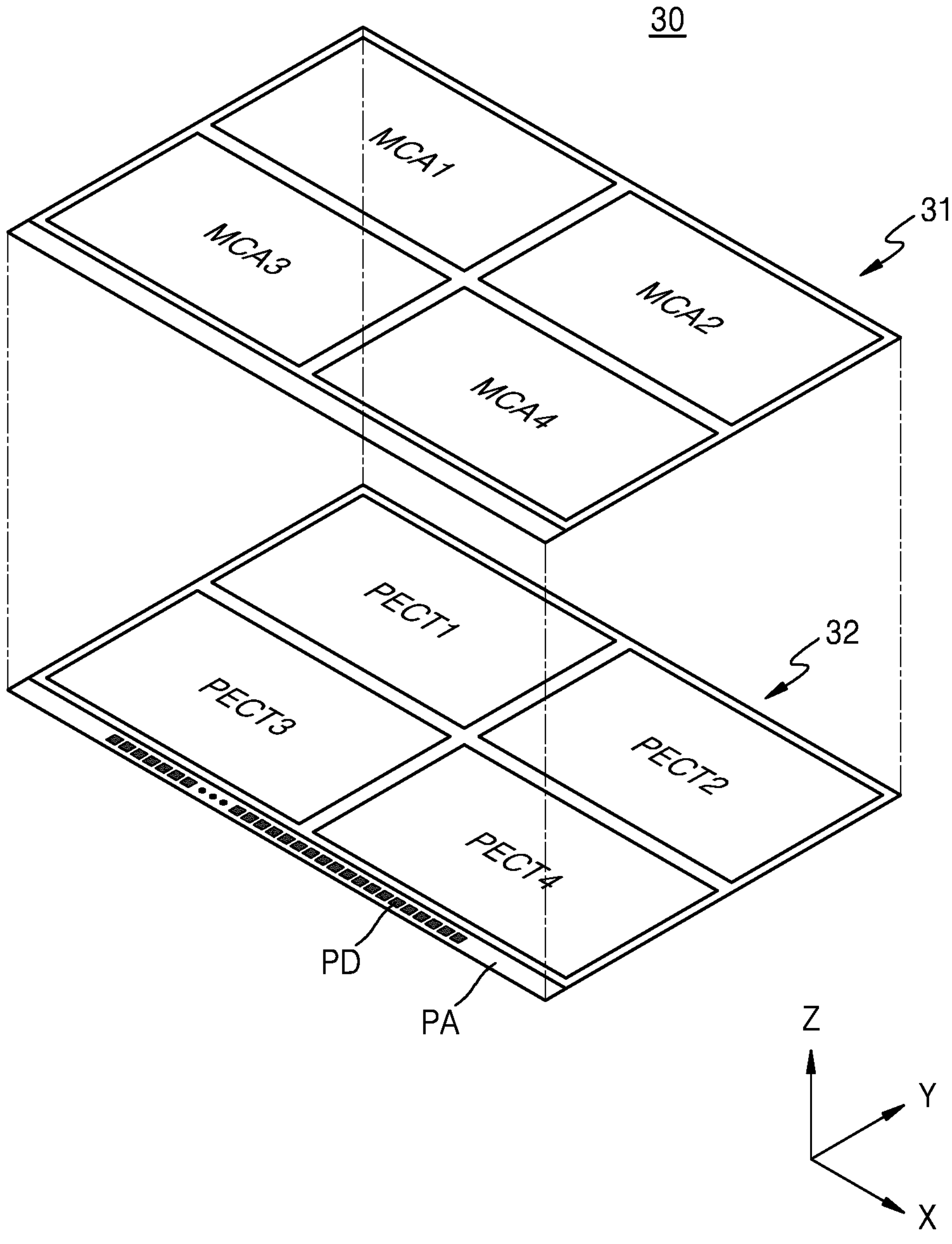
FIG. 3 schematically illustrates a structure of a memory device according to one or more example embodiments.
Figure 4:
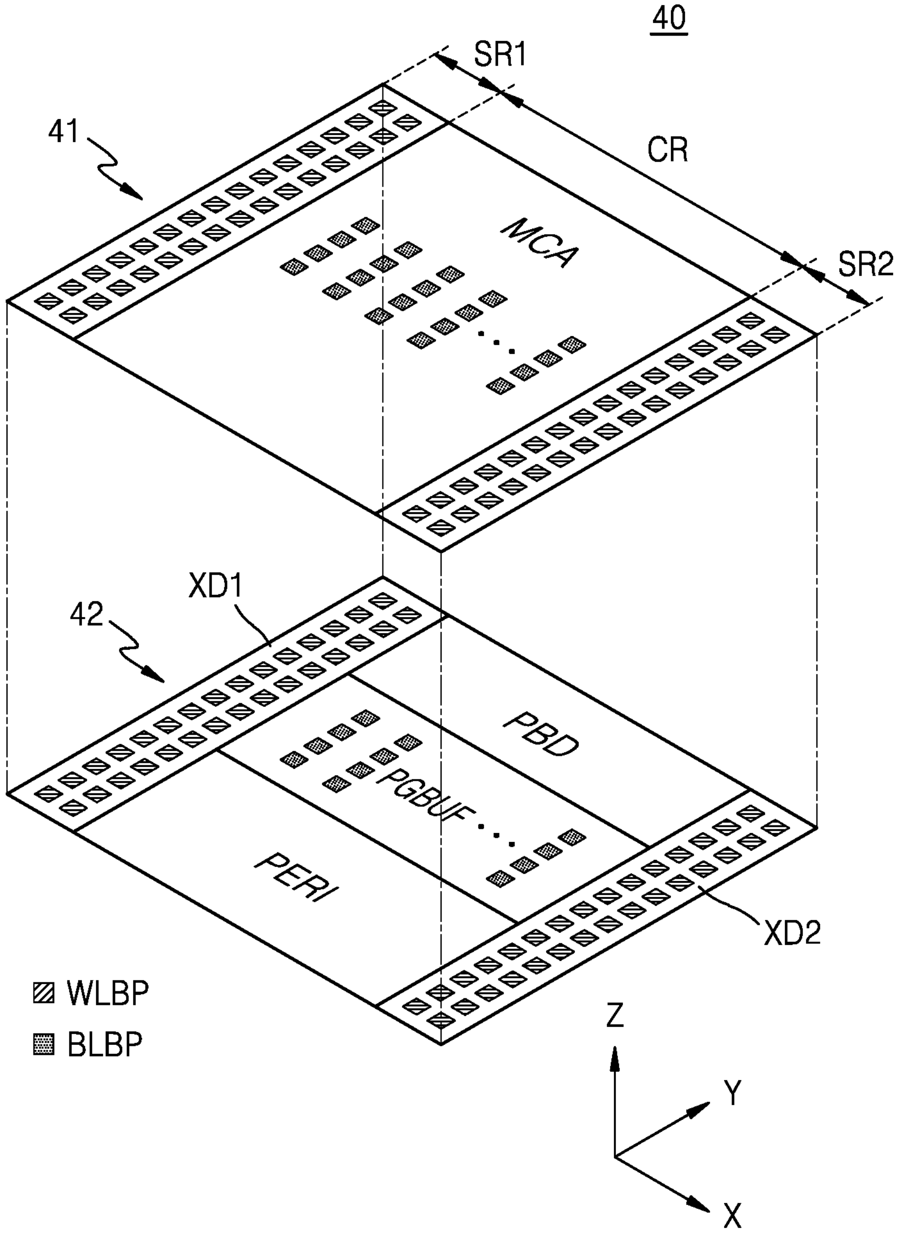
FIG. 4 illustrates a memory device having a B-VNAND structure, according to one or more example embodiments.
Figure 22:
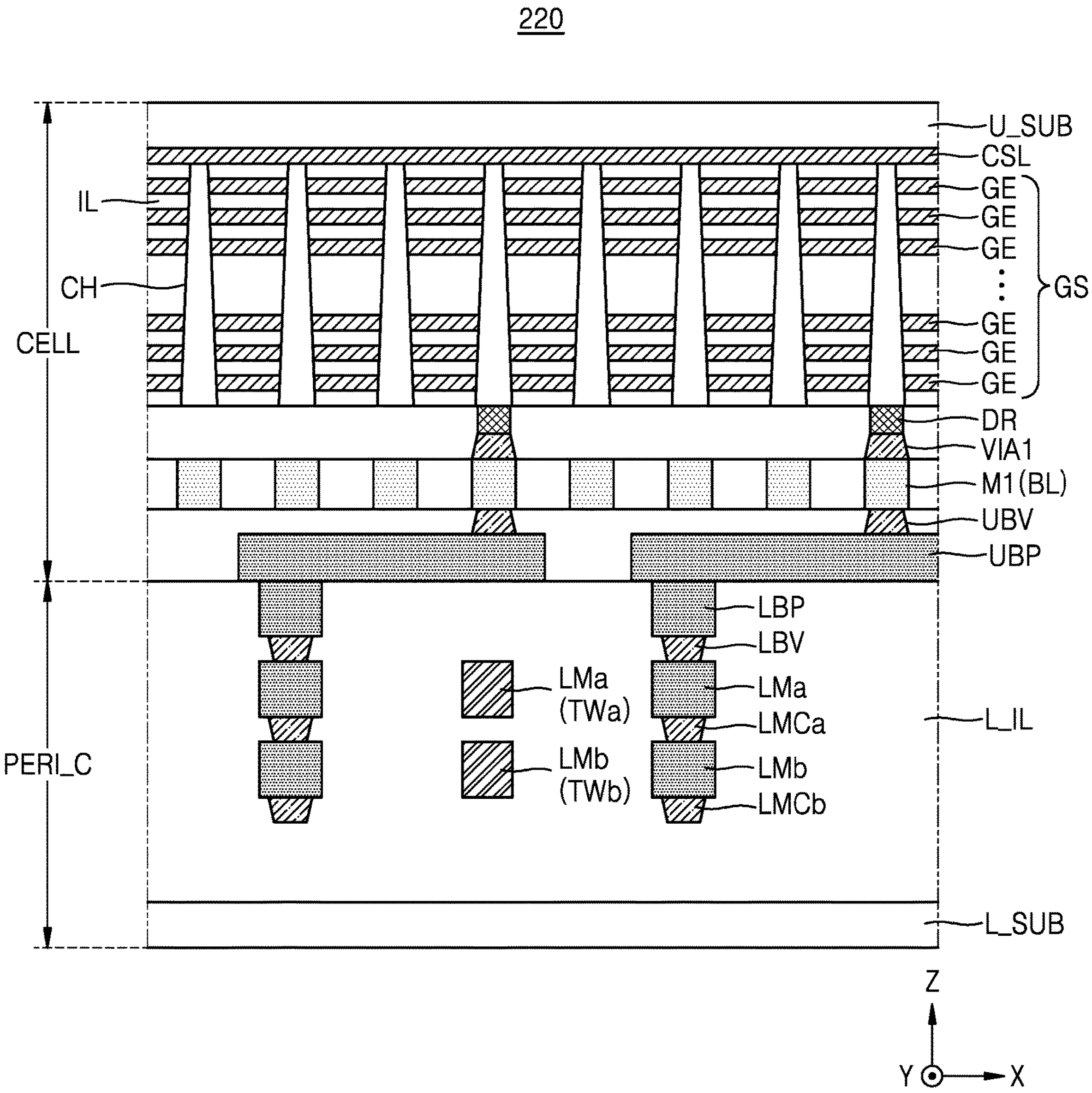
FIG. 22 is a cross-sectional view illustrating a memory device according to one or more example embodiments.
Figure 23:
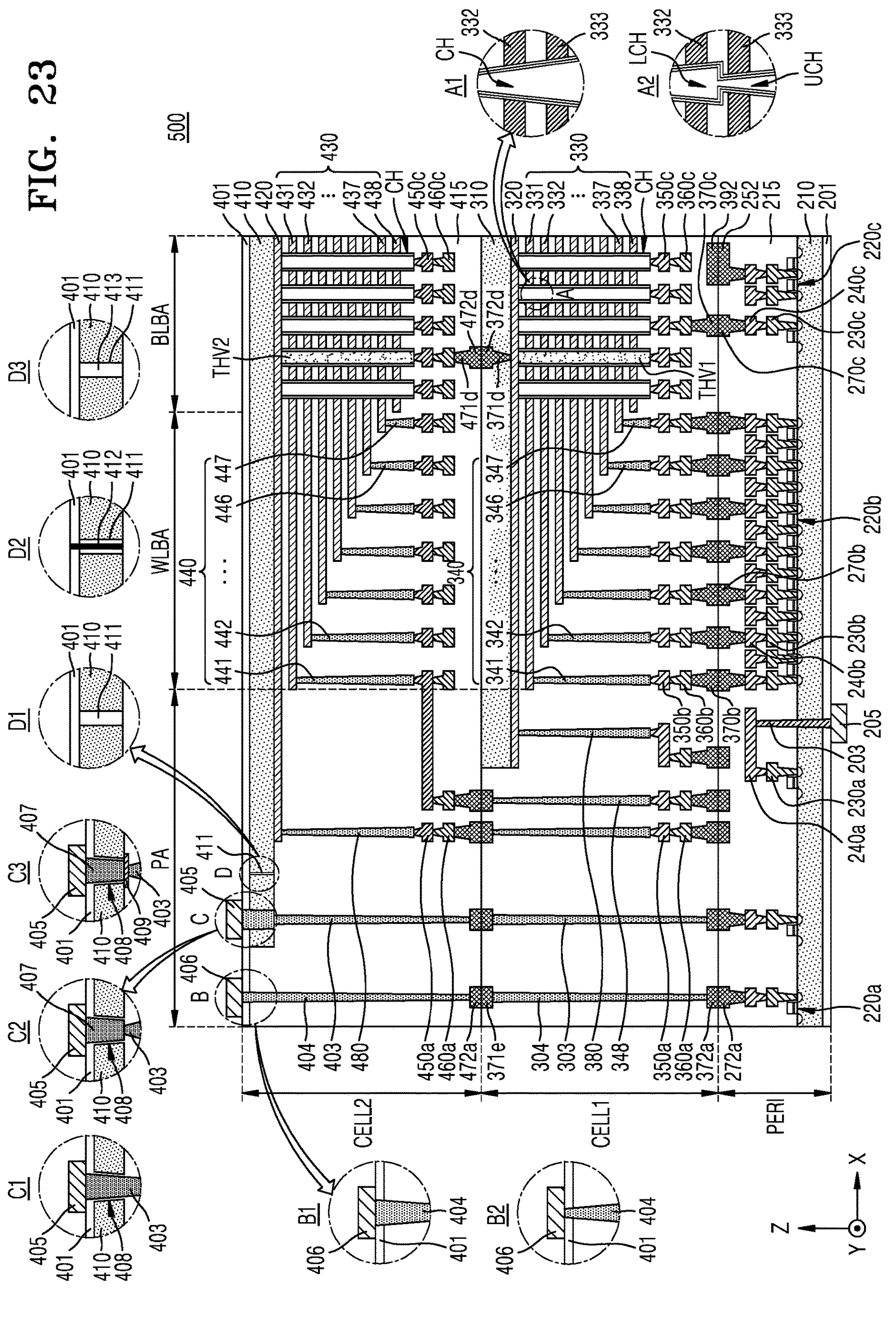
FIG. 23 is a cross-sectional view of a memory device having a B-VNAND structure, according to one or more example embodiments.

According to one or more example embodiments, the memory cell array 11 may be arranged in a memory cell region, a first semiconductor layer, a first wafer, a first semiconductor chip, or a memory chip (for example, 31 of FIG. 3, 41 of FIG. 4, CELL of FIGS. 11A, 19, and 22, or CELL1 and CELL2 of FIGS. 12A and 23), and the peripheral circuit PECT may be arranged in a peripheral circuit region, a second semiconductor layer, a second wafer, a second semiconductor chip, or a peripheral circuit chip (for example, 32 of FIG. 3, 42 of FIG. 4, PERI_C of FIGS. 11A, 12A, 19, and 22, or PERI of FIG. 23). Therefore, at least a portion of the peripheral circuit PECT may overlap the memory cell array 11 in the vertical direction.

In one or more example embodiments, the memory cell region of the memory device 10 may include a plurality of bit lines BL each extending in the first direction and a plurality of upper bonding pads respectively connected to the plurality of bit lines BL, and the peripheral circuit region of the memory device 10 may include the page buffer circuit 12, a plurality of lower bonding pads arranged above the page buffer circuit 12 and respectively connected to the plurality of upper bonding pads, and a plurality of through-wiring lines each extending in the first direction. According to one or more example embodiments, the plurality of lower bonding pads may include first lower bonding pads, which are included in a first bonding pad group and arranged in a line in the first direction, and second lower bonding pads, which are included in a second bonding pad group and arranged in a line in the first direction. According to one or more example embodiments, the plurality of through-wiring lines may include at least one first through-wiring line between the first bonding pad group and the second bonding pad group and across the page buffer circuit 12. Various embodiments for this are described below with reference to FIGS. 7A, 7B, 8A, 8B, 9A. 9B, 10A and 10B.

Figure 2:
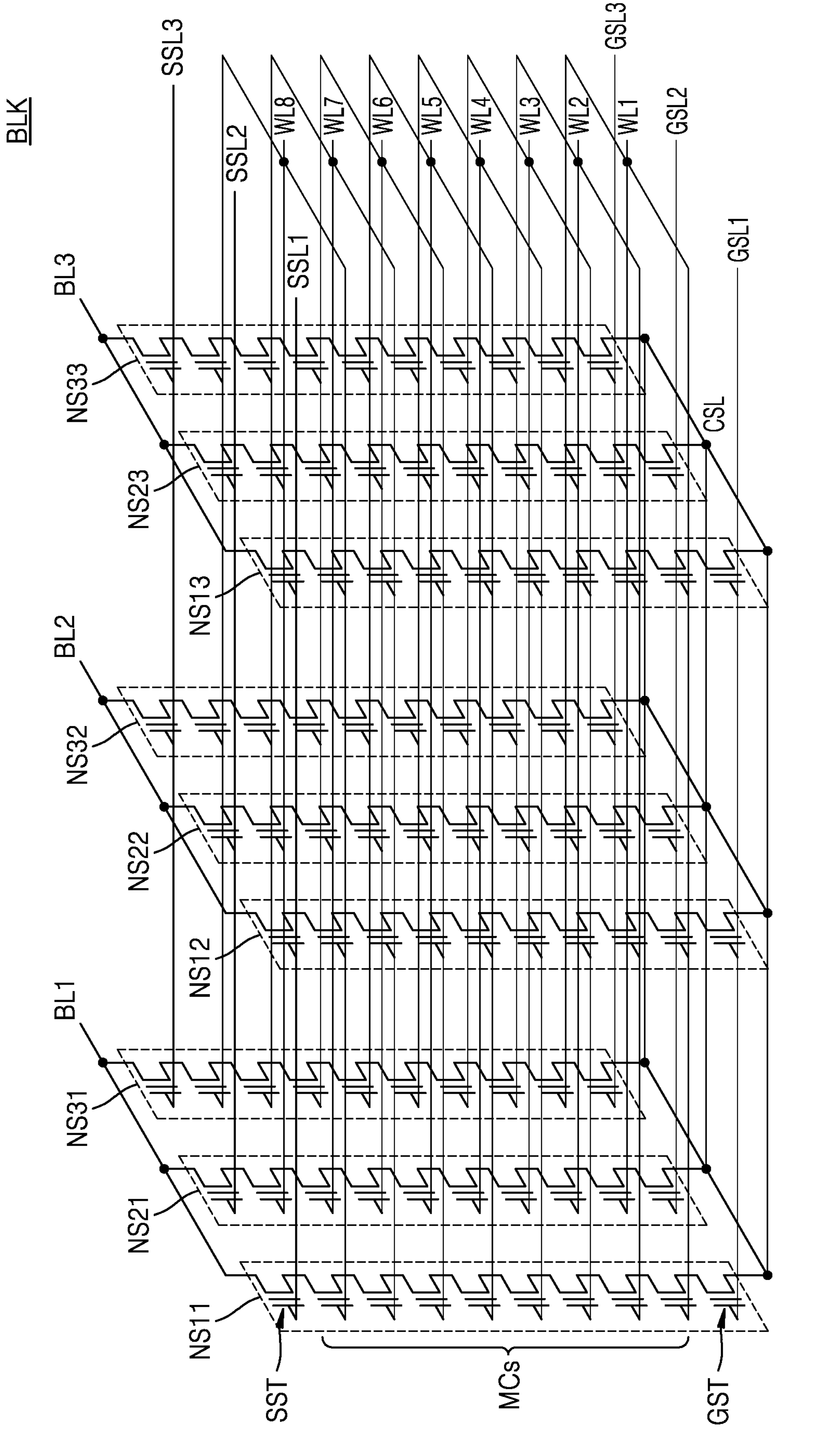
FIG. 2 is a circuit diagram illustrating a memory block according to one or more example embodiments.

FIG. 2 is a circuit diagram illustrating a memory block BLK according to one or more example embodiments.

Referring to FIG. 2, the memory block BLK may correspond to one of the plurality of memory blocks BLK1 to BLKz of FIG. 1. The memory block BLK may include NAND strings NS11 to NS33, and each NAND string (for example, NS11) may include a string select transistor SST, a plurality of memory cells MCs, and a ground select transistor GST, which are connected in series. The string select and ground select transistors SST and GST and the memory cells MCs, which are included in each NAND string, may form a structure stacked in the vertical direction over a substrate.

Bit lines (that is, BL1 to BL3) may extend in a first direction (for example, a Y direction of FIG. 3), and word lines WL1 to WL8 may extend in a second direction (for example, an X direction of FIG. 3). Depending on one or more example embodiments, the first direction may be referred to as a first horizontal direction, and the second direction may be referred to as a second horizontal direction. The NAND strings NS11, NS21, and NS31 may be arranged between a first bit line BL1 and a common source line CSL, the NAND strings NS12, NS22, and NS32 may be arranged between a second bit line BL2 and the common source line CSL, and the NAND strings NS13, NS23, and NS33 may be arranged between a third bit line BL3 and the common source line CSL.

The string select transistors SST may be respectively connected to string select lines SSL1 to SSL3 corresponding thereto. The memory cells MCs may be respectively connected to the word lines WL1 to WL8 corresponding thereto. The ground select transistors GST may be respectively connected to ground select lines GSL1 to GSL3 corresponding thereto. The string select transistors SST may be respectively connected to the bit lines corresponding thereto, and the ground select transistors GST may be connected to the common source line CSL. According to one or more example embodiments, the number of NAND strings, the number of word lines, the number of bit lines, the number of ground select lines, and the number of string select lines may vary.

FIG. 3 schematically illustrates a structure of a memory device 30 according to one or more example embodiments.

Referring to FIG. 3, the memory device 30 may include a memory cell region 31 and a peripheral circuit region 32 and may correspond to one or more example embodiments of the memory device 10 of FIG. 1. The memory cell region 31 may be formed in a first wafer, and thus, may be referred to as a memory chip or a first semiconductor chip. The peripheral circuit region 32 may be formed in a second wafer, and thus, may be referred to as a peripheral circuit chip or a second semiconductor chip. In one or more example embodiments, the memory cell region 31 and the peripheral circuit region 32 may be connected to each other in a vertical direction (Z direction) in a bonding manner, and thus, the memory device 30 may be referred to as a bonding vertical NAND (B-VNAND)-type memory device or a chip-to-chip (C2C) bonding-structure memory device.

In one or more example embodiments, the memory cell region 31 may include first to fourth memory cell arrays MCA1 to MCA4. According to one or more example embodiments, each of the first to fourth memory cell arrays MCA1 to MCA4 may be referred to as a memory plane or a memory array tile (MAT), and thus, the memory cell array 31 may have a 4-MAT structure. The peripheral circuit region 32 may include first to fourth peripheral circuits PECT1 to PECT4 respectively corresponding to the first to fourth memory cell arrays MCA1 to MCA4. In addition, the peripheral circuit region 32 may further include a pad region PA in which a plurality of pads PD are arranged.

FIG. 4 illustrates a memory device 40 having a B-VNAND structure, according to one or more example embodiments.

Referring to FIG. 4, the memory device 40 may include a first semiconductor chip 41 and a second semiconductor chip 42, and the memory device 40 may be implemented by a B-VNAND type or a C2C bonding structure. According to the C2C bonding structure, a horizontal-direction area of the memory device 40 may be effectively reduced, and the degree of integration of the memory device 40 may improve.

Depending on one or more example embodiments, the first semiconductor chip 41 may be referred to as a first semiconductor layer, a first wafer, a first chip, a first die, an upper semiconductor layer, an upper wafer, an upper chip, an upper semiconductor chip, or a memory cell region. Depending on one or more example embodiments, the second semiconductor chip 42 may be referred to as a second semiconductor layer, a second wafer, a second chip, a second die, a lower semiconductor layer, a lower wafer, a lower chip, a lower semiconductor chip, or a peripheral circuit region.

The first semiconductor chip 41 may include a cell region CR and stair regions or stepwise regions SR1 and SR2. A memory cell array MCA including vertical-structured NAND strings may be arranged in the cell region CR. For example, the memory cell array MCA may correspond to one of the first to fourth memory cell arrays MCA1 to MCA4 of FIG. 3. The stepwise regions SR1 and SR2 may be respectively arranged on both sides of the cell region CR and may be referred to as word line extension regions. In the first semiconductor chip 41, bit line bonding pads BLBP may be arranged in the cell region CR, and word line bonding pads WLBP may be arranged in the stepwise regions SR1 and SR2. According to one or more example embodiments, the bit line bonding pads BLBP and the word line bonding pads WLBP, which are arranged in the first semiconductor chip 41, may be referred to as "upper bonding pads".

The second semiconductor chip 42 may include row decoders XD1 and XD2, a peripheral circuit PERI, a page buffer circuit PGBUF, and a page buffer decoder PBD. For example, the row decoders XD1 and XD2 may be arranged in regions corresponding to the stepwise regions SR1 and SR2, respectively, and the peripheral circuit PERI, the page buffer circuit PGBUF, and the page buffer decoder PBD may be arranged in a region corresponding to the cell region CR. In the second semiconductor chip 42, the bit line bonding pads BLBP may be arranged above the page buffer circuit PGBUF, and the word line bonding pads WLBP may be arranged above the row decoders XD1 and XD2. According to one or more example embodiments, the bit line bonding pads BLBP and the word line bonding pads WLBP, which are arranged in the second semiconductor chip 42, may be referred to as "lower bonding pads".

Figure 5:
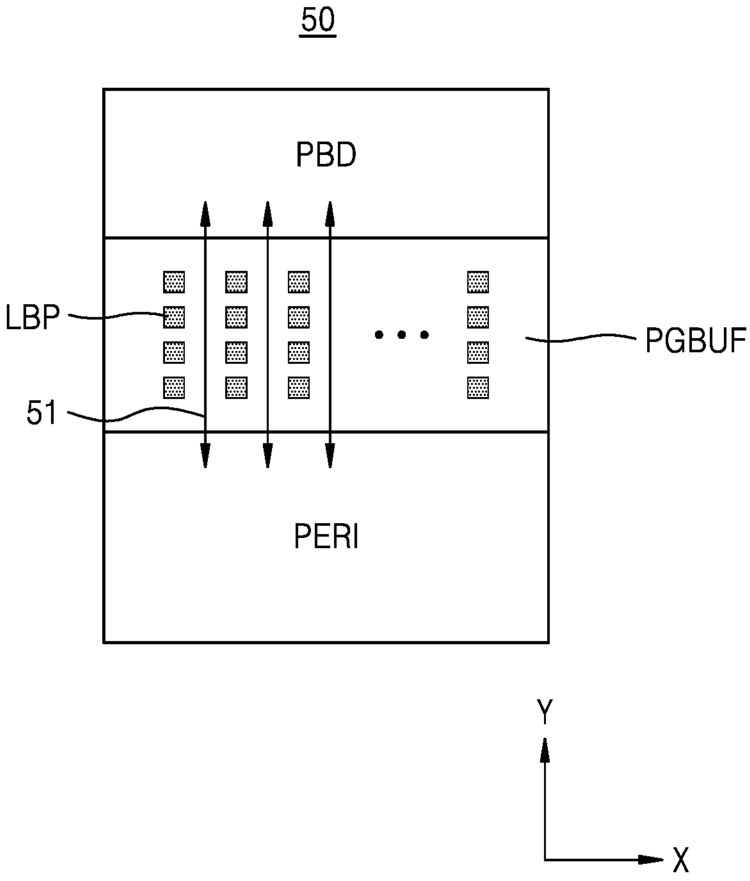
FIG. 5 is a plan view illustrating a peripheral circuit region according to one or more example embodiments.

FIG. 5 illustrates a peripheral circuit region 50 according to one or more example embodiments.

Referring to FIG. 5, the peripheral circuit region 50 may include the peripheral circuit PERI, the page buffer circuit PGBUF, and the page buffer decoder PBD, which are arranged in a first direction (Y direction). For example, the peripheral circuit region 50 may correspond to some regions of the second semiconductor chip 42 of FIG. 4. A wiring line 51 for connection between the peripheral circuit PERI and the page buffer decoder PBD may extend in the first direction (Y direction) and thus pass through the page buffer circuit PGBUF. Therefore, the wiring line 51 may be referred to as a "through-wiring line".

According to one or more example embodiments, the through-wiring line 51 may be a wiring line for transferring a power supply voltage that is provided to the page buffer decoder PBD from the peripheral circuit PERI. For example, the through-wiring line 51 may be a wiring line for transferring a ground voltage that is provided to the page buffer decoder PBD from the peripheral circuit PERI. For example, the through-wiring line 51 may be a wiring line for transferring a control signal that is provided to the page buffer decoder PBD from the peripheral circuit PERI. For example, the through-wiring line 51 may be a wiring line for transferring an output signal that is provided to the peripheral circuit PERI from the page buffer decoder PBD.

Bit line bonding pads on the peripheral circuit region 50, that is, lower bonding pads LBP, may be arranged in a matrix form in the first direction (Y direction) and the second direction (X direction) above the page buffer circuit PGBUF. According to one or more example embodiments, the lower bonding pads LBP included in the same lower bonding pad column may be arranged in a line in the first direction (Y direction). The lower bonding pads LBP arranged in a line in the first direction (Y direction) may constitute a "bonding pad group" or a "bit line bonding pad group". The through-wiring line 51 may extend in the first direction (Y direction) between adjacent lower bonding pad columns or adjacent bonding pad groups and thus cross the page buffer circuit PGBUF. Therefore, the lower bonding pad column or the bonding pad group and the through-wiring line 51 may be alternately arranged.

Figure 6A:
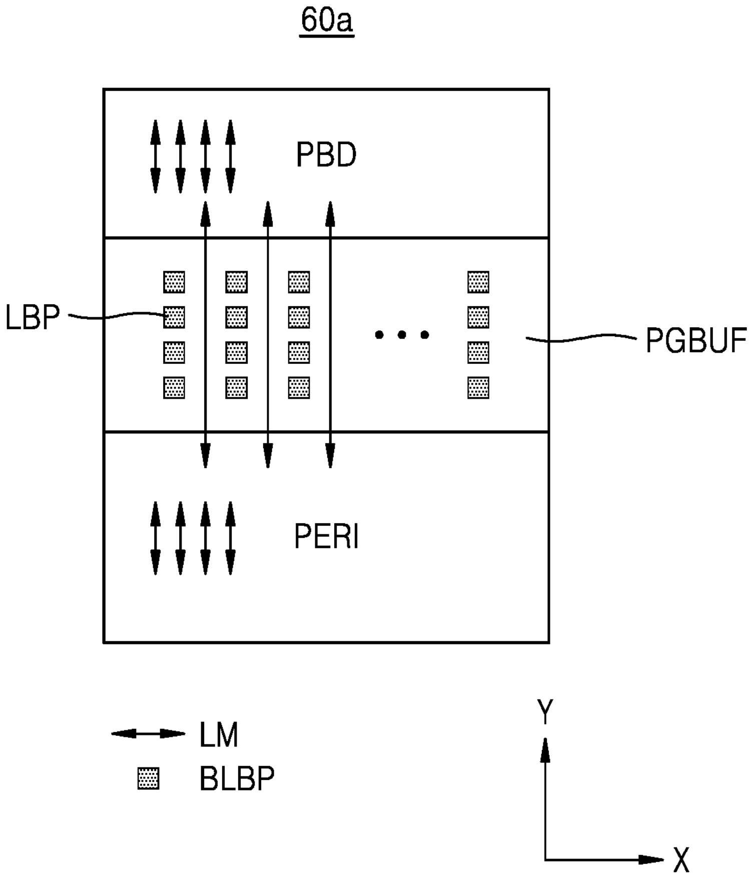
FIG. 6A illustrates a through-wiring line arranged in a peripheral circuit region, according to one or more example embodiments.

FIG. 6A illustrates a through-wiring line arranged in a peripheral circuit region 60*a*, according to one or more example embodiments.

Referring to FIG. 6A, the peripheral circuit region 60*a* corresponds to one or more example embodiments of the peripheral circuit region 50 of FIG. 5, and duplicate descriptions thereof are omitted. In the peripheral circuit region 60*a*, a through-wiring line may be implemented by a lower metal layer LM. For example, the lower metal layer LM may include wiring lines each extending in the first direction (Y direction) above the peripheral circuit PERI, wiring lines each extending in the first direction (Y direction) above the page buffer circuit PGBUF, and wiring lines each extending in the first direction (Y direction) above the page buffer decoder PBD. The peripheral circuit PERI and the page buffer decoder PBD may be electrically connected to each other via the lower metal layer LM. Specifically, the wiring lines each extending in the first direction (Y direction) above the peripheral circuit PERI may be electrically connected with the wiring lines each extending in the first direction (Y direction) above the page buffer decoder PBD via the wiring lines each extending in the first direction (Y direction) above the page buffer circuit PGBUF, respectively.

Figure 6B:
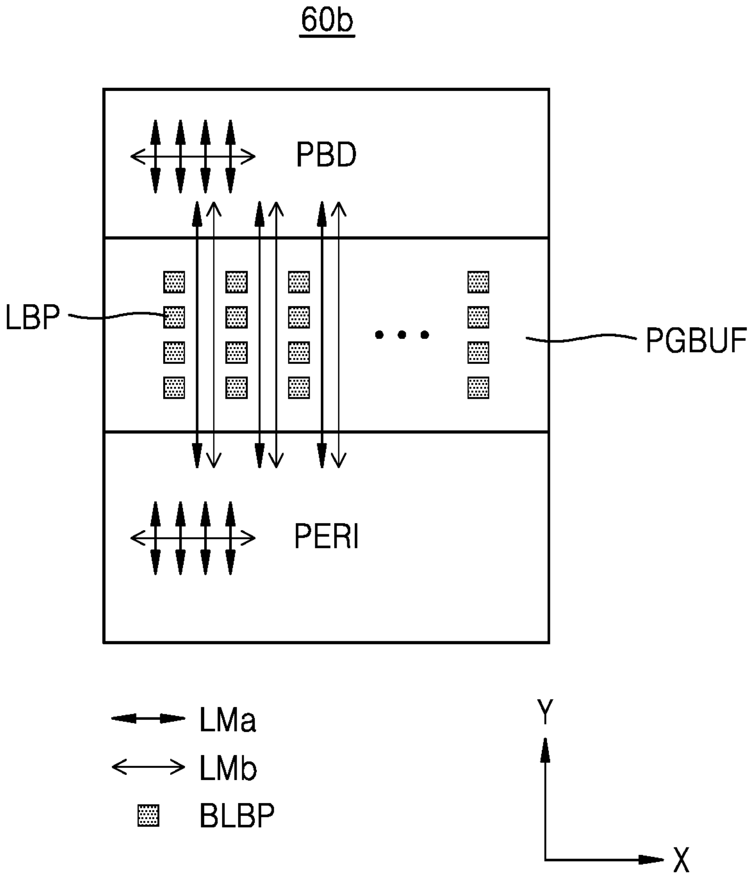
FIG. 6B illustrates a through-wiring line arranged in a peripheral circuit region, according to one or more example embodiments.

FIG. 6B illustrates a through-wiring line arranged in a peripheral circuit region 60*b*, according to one or more example embodiments.

Referring to FIG. 6B, the peripheral circuit region 60*b* corresponds to one or more example embodiments of the peripheral circuit region 50 of FIG. 5, and duplicate descriptions thereof are omitted. In the peripheral circuit region 60*b*, a through-wiring line may be implemented by a plurality of lower metal layers LMa and LMb respectively arranged at different levels. However, one or more example embodiments are not limited thereto, and according to one or more example embodiments, the through-wiring line may be implemented by three or more metal layers.

For example, the lower metal layer LMa may include wiring lines each extending in the first direction (Y direction) above the peripheral circuit PERI, wiring lines each extending in the first direction (Y direction) above the page buffer circuit PGBUF, and wiring lines each extending in the first direction (Y direction) above the page buffer decoder PBD. For example, the lower metal layer LMb may include a wiring line extending in the second direction (X direction) above the peripheral circuit PERI, wiring lines each extending in the first direction (Y direction) above the page buffer circuit PGBUF, and a wiring line extending in the second direction (X direction) above the page buffer decoder PBD.

The peripheral circuit PERI and the page buffer decoder PBD may be electrically connected to each other via the lower metal layers LMa and LMb.

Figure 7A:
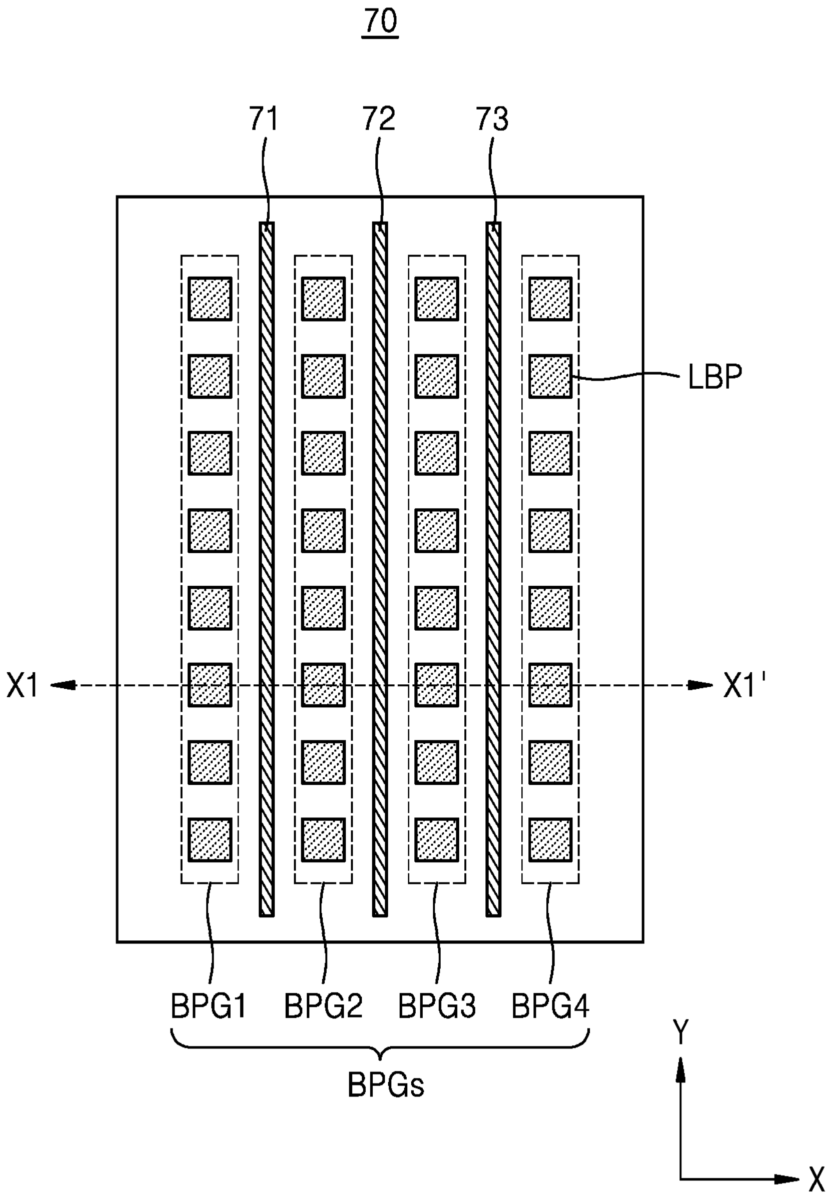
FIG. 7A illustrates lower bonding pads and through-wiring lines according to one or more example embodiments.
Figure 7B:
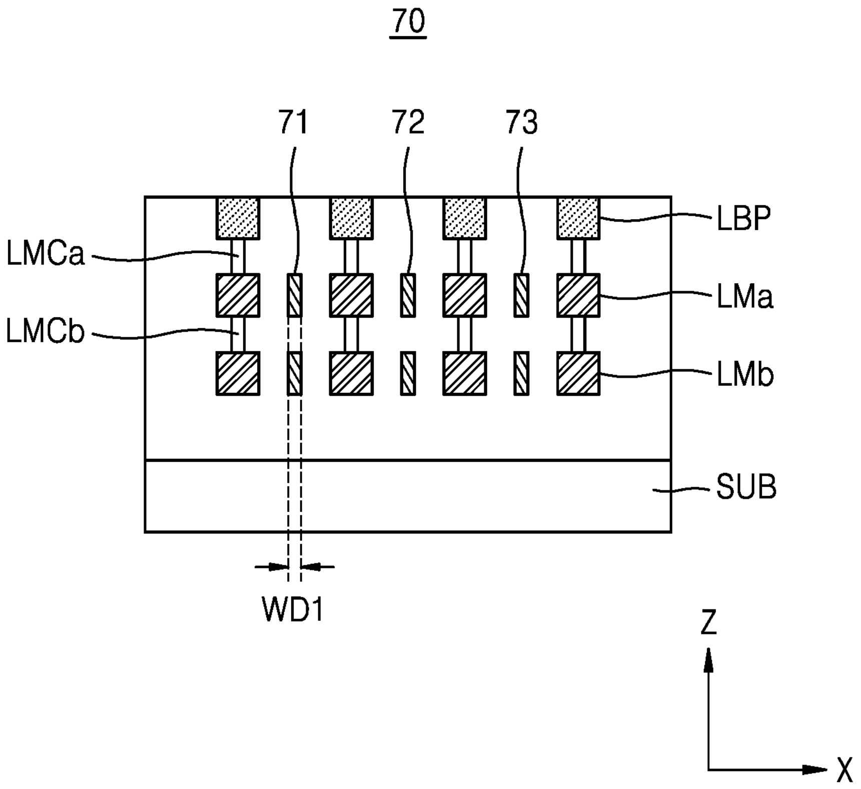
FIG. 7B is a cross-sectional view thereof, taken along a line X1-X1' of FIG. 7A, according to one or more example embodiments.

FIG. 7A illustrates lower bonding pads and through-wiring lines according to one or more example embodiments, and FIG. 7B is a cross-sectional view thereof, taken along a line X1-X1' of FIG. 7A according to one or more example embodiments.

Referring together to FIGS. 7A and 7B, a peripheral circuit region 70 may include a substrate SUB, the lower metal layers LMa and LMb, lower metal contacts LMCa and LMCb, and the lower bonding pads LBP. The lower bonding pads LBP may be grouped into a plurality of bonding pad groups BPGs including first to fourth bonding pad groups BPG1 to BPG4. The first to fourth bonding pad groups BPG1 to BPG4 may be apart from each other in the second direction (X direction), and each of the first to fourth bonding pad groups BPG1 to BPG4 may include a plurality of lower bonding pads LBP arranged in a line in the first direction (Y direction).

In addition, the peripheral circuit region 70 may include through-wiring lines 71, 72, and 73 each arranged between adjacent bonding pad groups from among the plurality of bonding pad groups BPGs. For example, the through-wiring line 71 may extend in the first direction (Y direction) between the first and second bonding pad groups BPG1 and BPG2, the through-wiring line 72 may extend in the first direction (Y direction) between the second and third bonding pad groups BPG2 and BPG3, and the through-wiring line 73 may extend in the first direction (Y direction) between the third and fourth bonding pad groups BPG3 and BPG4.

Each of the through-wiring lines 71, 72, and 73 may have a first width WD1 in the second direction (X direction). However, one or more example embodiments are not limited thereto, and the through-wiring lines 71, 72, and 73 may have different widths from each other. For example, each of the through-wiring lines 71, 72, and 73 may include the lower metal layers LMa and LMb respectively arranged at different levels. In one or more example embodiments, different signals, for example, a control signal and an output signal, may be respectively transferred through the lower metal layers LMa and LMb. However, one or more example embodiments are not limited thereto, and the same signal may be transferred through the lower metal layers LMa and LMb, depending on one or more example embodiments.

Figure 8A:
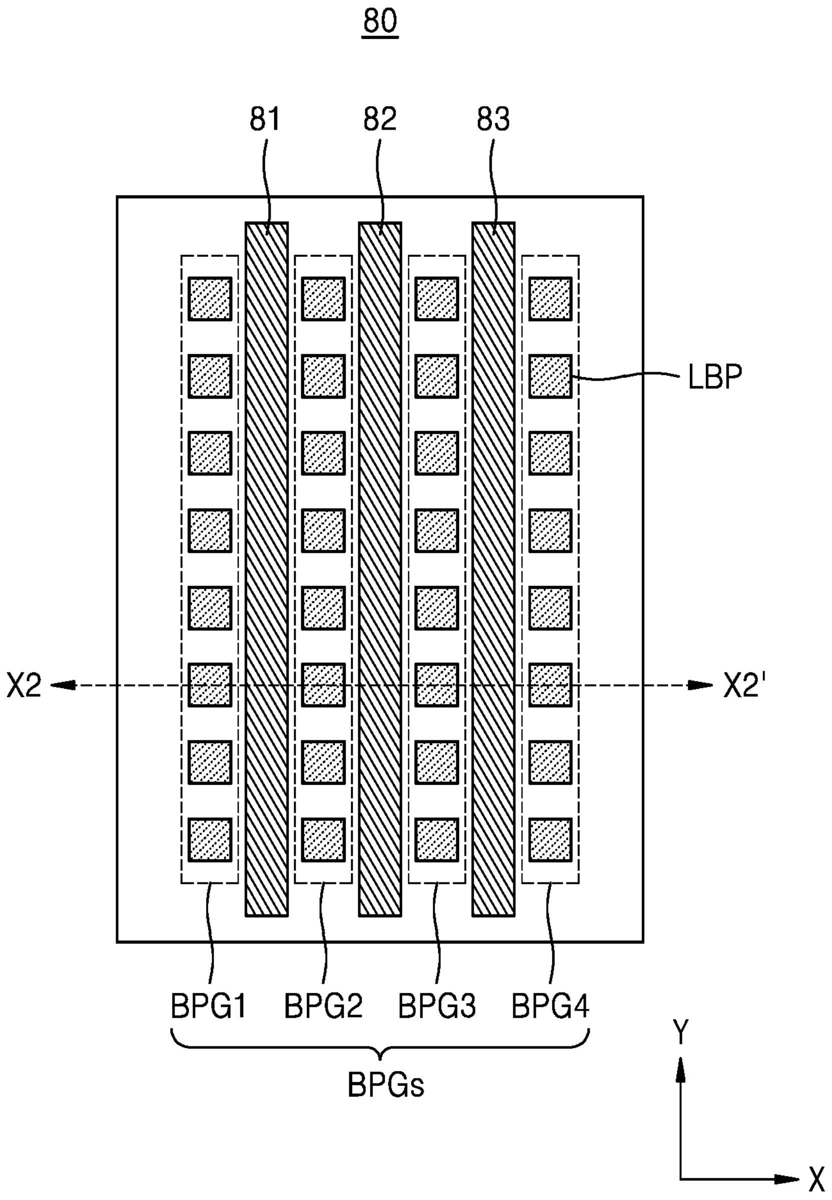
FIG. 8A illustrates lower bonding pads and through-wiring lines according to one or more example embodiments.
Figure 8B:
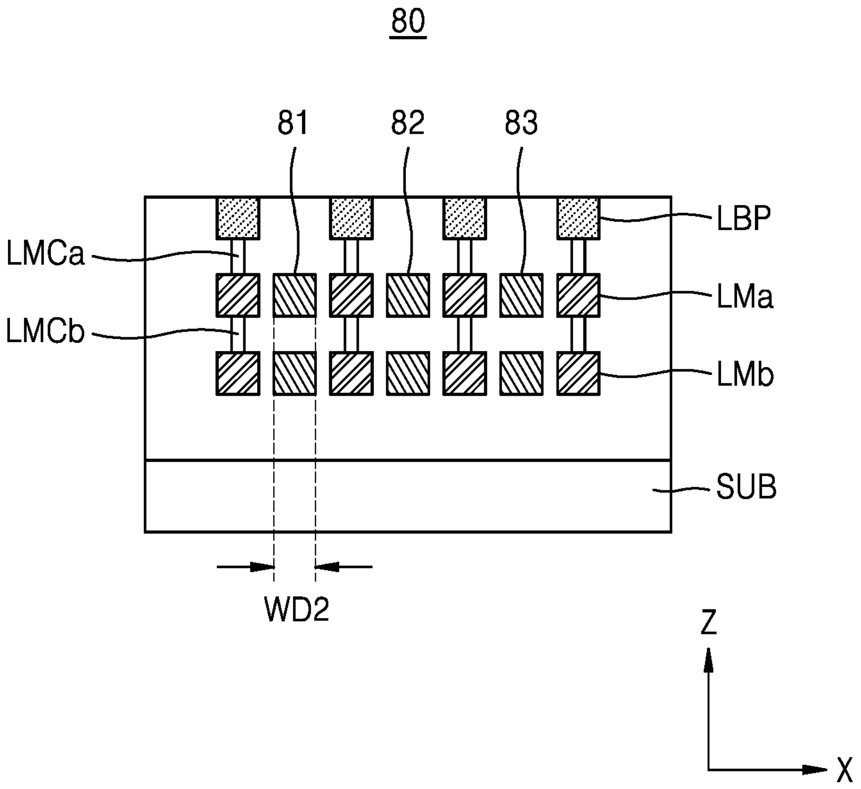
FIG. 8B is a cross-sectional view thereof, taken along a line X2-X2' of FIG. 8A, according to one or more example embodiments.

FIG. 8A illustrates lower bonding pads and through-wiring lines according to one or more example embodiments, and FIG. 8B is a cross-sectional view thereof, taken along a line X2-X2' of FIG. 8A according to one or more example embodiments.

Referring together to FIGS. 8A and 8B, a peripheral circuit region 80 corresponds to a modified one or more example embodiments of the peripheral circuit region 70 of FIG. 7A, and duplicate descriptions thereof are omitted. The peripheral circuit region 80 may include the substrate SUB, the lower metal layers LMa and LMb, the lower metal contacts LMCa and LMCb, and the lower bonding pads LBP. In addition, the peripheral circuit region 80 may include through-wiring lines 81, 82, and 83 each arranged between adjacent bonding pad groups from among the plurality of bonding pad groups BPGs. For example, the through-wiring line 81 may extend in the first direction (Y direction) between the first and second bonding pad groups BPG1 and BPG2, the through-wiring line 82 may extend in the first direction (Y direction) between the second and third bonding pad groups BPG2 and BPG3, and the through-wiring line 83 may extend in the first direction (Y direction) between the third and fourth bonding pad groups BPG3 and BPG4.

Each of the through-wiring lines 81, 82, and 83 may have a second width WD2 in the second direction (X direction). According to one or more example embodiments, the second width WD2 may be greater than the first width WD1 of FIG. 7B. However, one or more example embodiments are not limited thereto, and the through-wiring lines 81, 82, and 83 may have different widths from each other. For example, each of the through-wiring lines 81, 82, and 83 may include the lower metal layers LMa and LMb respectively arranged at different levels. In one or more example embodiments, different signals, for example, a power supply voltage and a ground voltage, may be respectively transferred through the lower metal layers LMa and LMb. However, one or more example embodiments are not limited thereto, and the same signal may be transferred through the lower metal layers LMa and LMb, depending on one or more example embodiments.

Figure 9A:
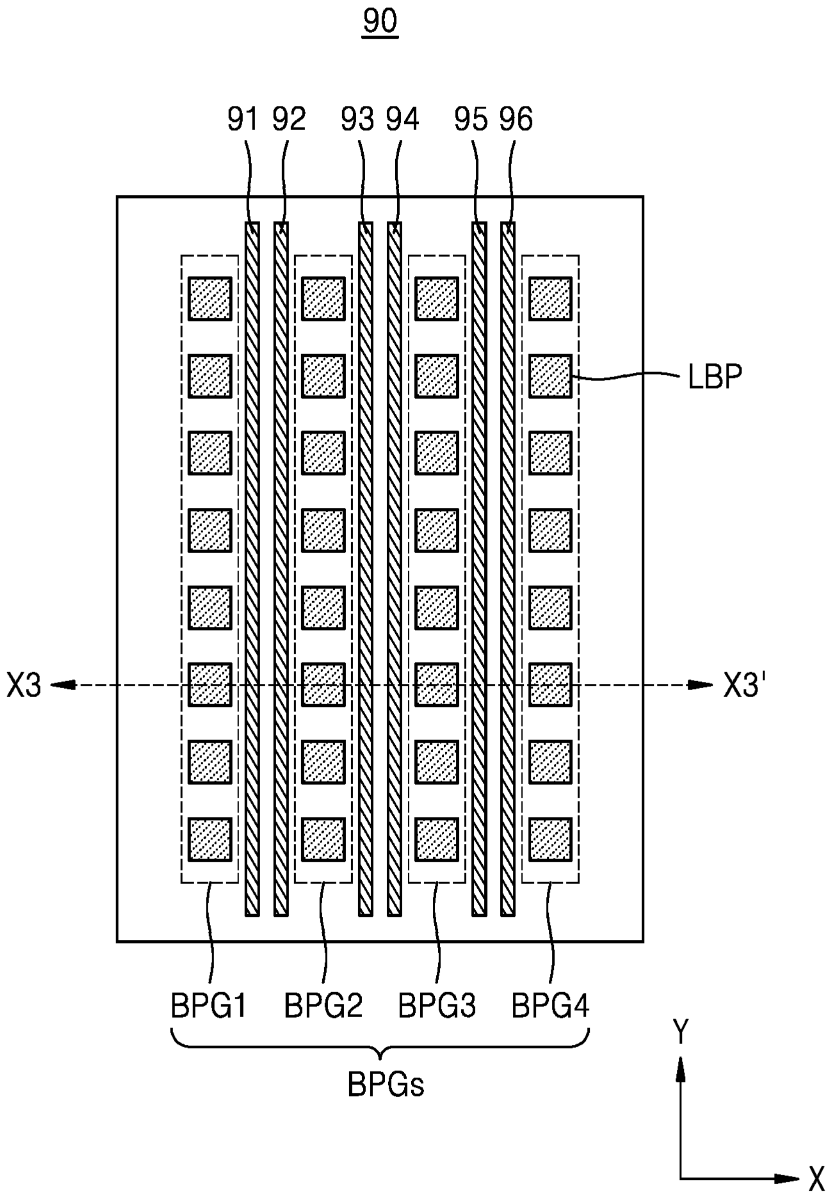
FIG. 9A illustrates lower bonding pads and through-wiring lines according to one or more example embodiments.
Figure 9B:
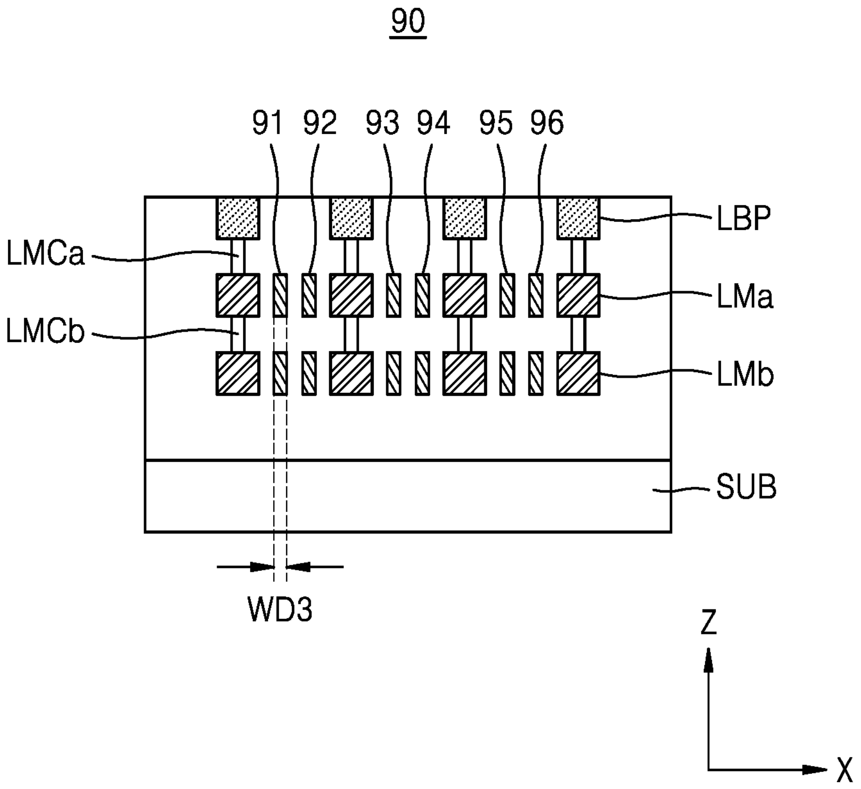
FIG. 9B is a cross-sectional view thereof, taken along a line X3-X3' of FIG. 9A, according to one or more example embodiments.

FIG. 9A illustrates lower bonding pads and through-wiring lines according to one or more example embodiments, and FIG. 9B is a cross-sectional view thereof, taken along a line X3-X3' of FIG. 9A according to one or more example embodiments.

Referring together to FIGS. 9A and 9B, a peripheral circuit region 90 corresponds to a modified one or more example embodiments of the peripheral circuit region 70 of FIG. 7A, and duplicate descriptions thereof are omitted. The peripheral circuit region 90 may include the substrate SUB, the lower metal layers LMa and LMb, the lower metal contacts LMCa and LMCb, and the lower bonding pads LBP. In addition, the peripheral circuit region 90 may include through-wiring lines 91 to 96 each arranged between adjacent bonding pad groups from among the plurality of bonding pad groups BPGs. For example, the through-wiring lines 91 and 92 may each extend in the first direction (Y direction) between the first and second bonding pad groups BPG1 and BPG2, the through-wiring lines 93 and 94 may each extend in the first direction (Y direction) between the second and third bonding pad groups BPG2 and BPG3, and the through-wiring lines 95 and 96 may each extend in the first direction (Y direction) between the third and fourth bonding pad groups BPG3 and BPG4.

Each of the through-wiring lines 91 to 96 may have a third width WD3 in the second direction (X direction). According to one or more example embodiments, the third width WD3 may be equal to or less than the first width WD1 of FIG. 7B. However, one or more example embodiments are not limited thereto, and the through-wiring lines 91 to 96 may have different widths from each other. For example, each of the through-wiring lines 91 to 96 may include the lower metal layers LMa and LMb respectively arranged at different levels. In one or more example embodiments, different signals may be respectively transferred through the lower metal layers LMa and LMb. However, one or more example embodiments are not limited thereto, and the same signal may be transferred through the lower metal layers LMa and LMb, depending on one or more example embodiments.

Figure 10A:
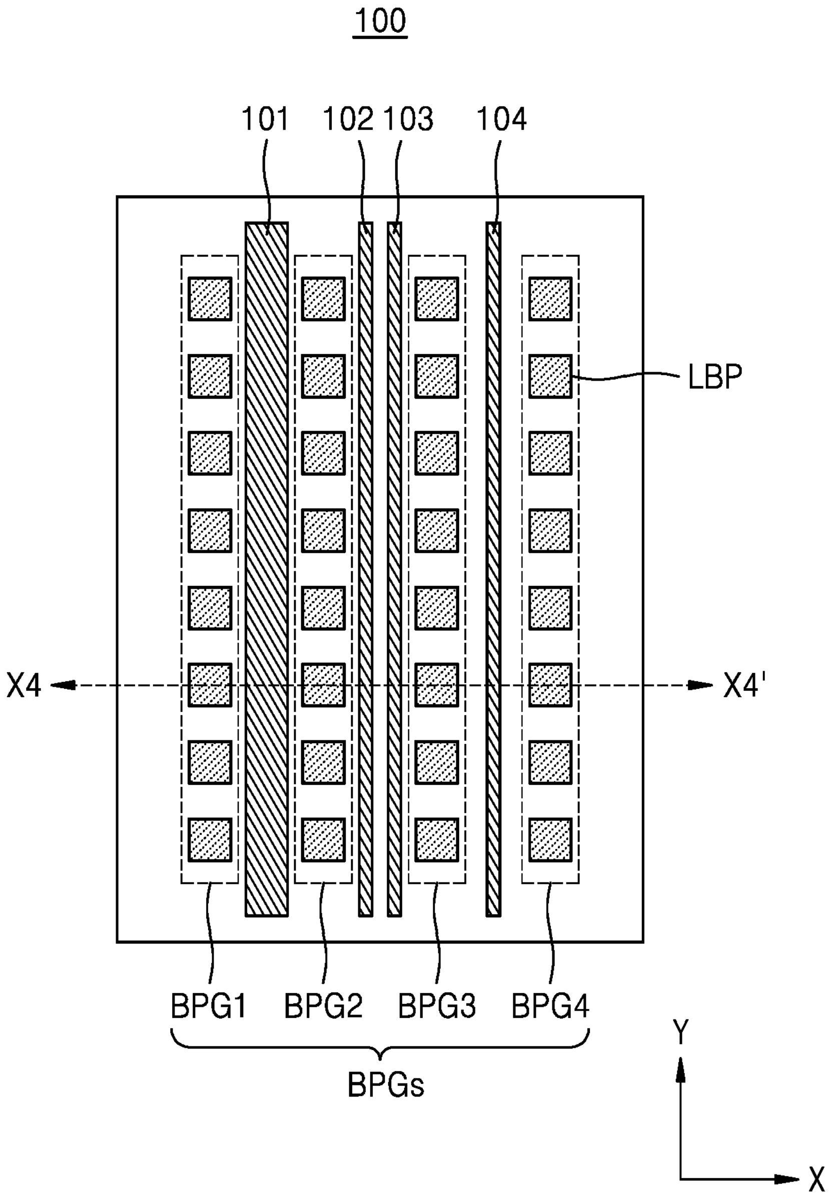
FIG. 10A illustrates lower bonding pads and through-wiring lines according to one or more example embodiments.
Figure 10B:
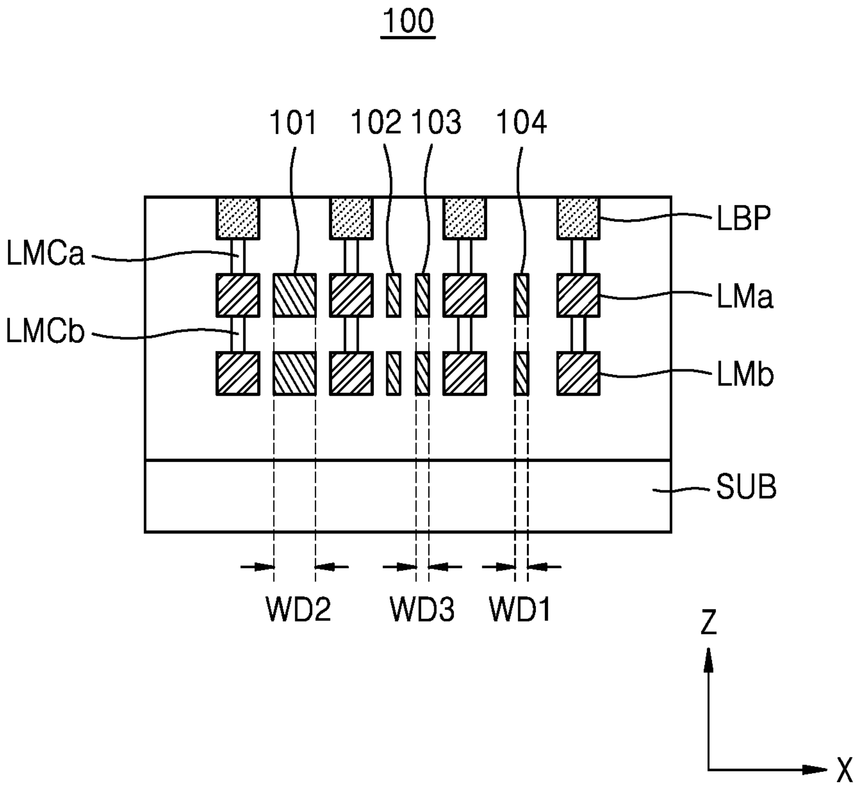
FIG. 10B is a cross-sectional view thereof, taken along a line X4-X4' of FIG. 10A, according to one or more example embodiments.

FIG. 10A illustrates lower bonding pads and through-wiring lines according to one or more example embodiments, and FIG. 10B is a cross-sectional view thereof, taken along a line X4-X4' of FIG. 10A according to one or more example embodiments.

Referring together to FIGS. 10A and 10B, a peripheral circuit region 100 corresponds to a modified one or more example embodiments of the peripheral circuit region 70 of FIG. 7A, and duplicate descriptions thereof are omitted. The peripheral circuit region 100 may include the substrate SUB, the lower metal layers LMa and LMb, the lower metal contacts LMCa and LMCb, and the lower bonding pads LBP. In addition, the peripheral circuit region 100 may include through-wiring lines 101 to 104 each arranged between adjacent bonding pad groups from among the plurality of bonding pad groups BPGs. For example, the through-wiring line 101 may extend in the first direction (Y direction) between the first and second bonding pad groups BPG1 and BPG2, the through-wiring lines 102 and 103 may each extend in the first direction (Y direction) between the second and third bonding pad groups BPG2 and BPG3, and the through-wiring line 104 may extend in the first direction (Y direction) between the third and fourth bonding pad groups BPG3 and BPG4.

The through-wiring line 101 may have the second width WD2 in the second direction (X direction), each of the through-wiring lines 102 and 103 may have the third width WD3 in the second direction (X direction), and the through-wiring line 104 may have the first width WD1 in the second direction (X direction). According to one or more example embodiments, the second width WD2 may be greater than each of the first width WD1 and the third width WD3. For example, each of the through-wiring lines 101 to 104 may include the lower metal layers LMa and LMb respectively arranged at different levels. In one or more example embodiments, different signals may be respectively transferred through the lower metal layers LMa and LMb. However, one or more example embodiments are not limited thereto, and the same signal may be transferred through the lower metal layers LMa and LMb, depending on one or more example embodiments.

Figure 11A:
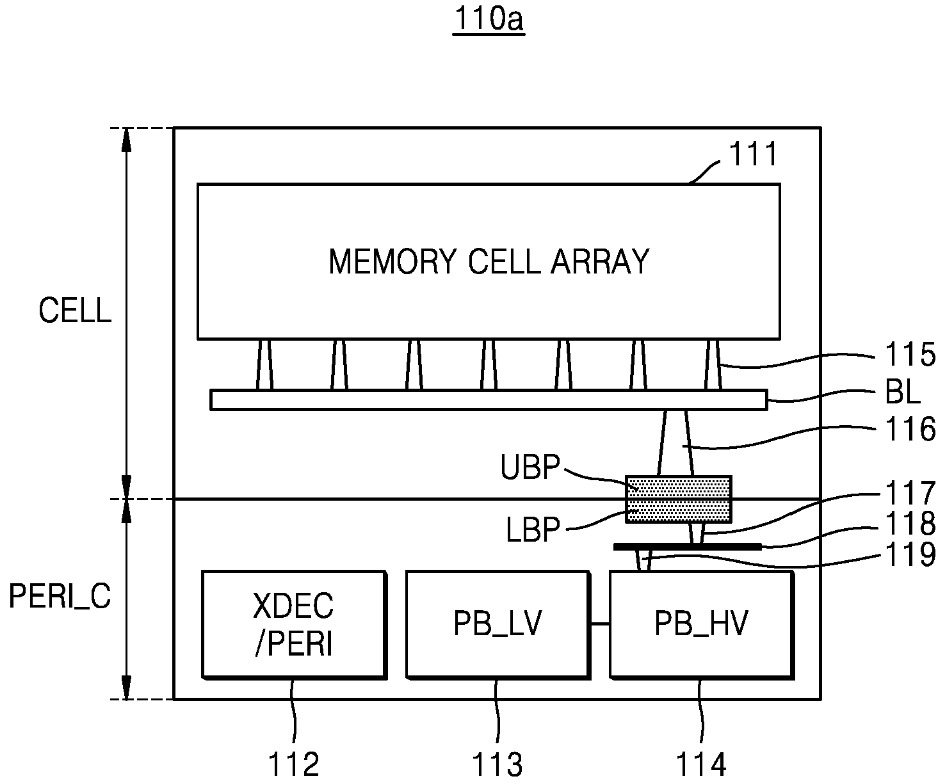
FIG. 11A illustrates a memory device according to one or more example embodiments.
Figure 11B:
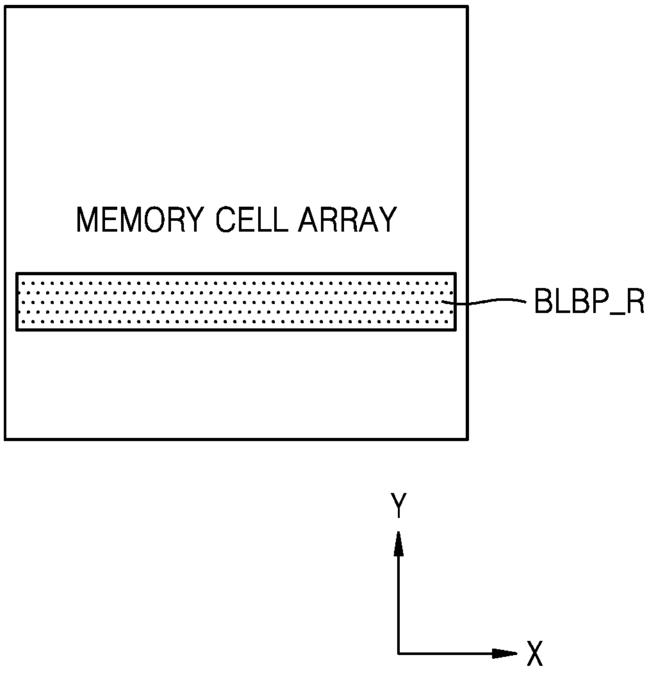
FIG. 11B is a plan view illustrating a memory cell region of FIG. 11A, according to one or more example embodiments.

FIG. 11A illustrates a memory device 110*a* according to one or more example embodiments, and FIG. 11B is a plan view illustrating a memory cell region of FIG. 11A according to one or more example embodiments.

Referring together to FIGS. 11A and 11B, the memory device 110*a* may include a memory cell region CELL and a peripheral circuit region PERI_C. The memory cell region CELL may include a memory cell array 111 and an upper bonding pad UBP. In the memory cell region CELL, the upper bonding pad UBP may be connected to a bit line BL through a via 116, and the bit line BL may be connected to the memory cell array 111 through a via 115. In the memory cell region CELL, a bit line bonding pad region BLBP_R, in which upper bonding pads UBP are arranged, may be a region corresponding to a high-voltage page buffer circuit 114 of the peripheral circuit region PERI_C.

The peripheral circuit region PERI_C may include a row decoder/peripheral circuit ("XDEC/PERI") 112, a low-voltage page buffer circuit 113 ("PB_LV"), the high-voltage page buffer circuit 114 ("PB_HV"), and a lower bonding pad LBP. In the peripheral circuit region PERI_C, the lower bonding pad LBP may be connected to the high-voltage page buffer circuit 114. For example, the lower bonding pad LBP may be connected to the high-voltage page buffer circuit 114 through vias 117 and 119 and a lower metal layer 118. According to one or more example embodiments, the low-voltage page buffer circuit 113 may include respective low-voltage regions (for example, LV of FIG. 15) of a plurality of page buffers (for example, PB of FIG. 1), which are included in a page buffer circuit, and the high-voltage page buffer circuit 114 may include respective high-voltage regions (for example, HV of FIG. 15) of the plurality of page buffers, which are included in the page buffer circuit.

Figure 12A:
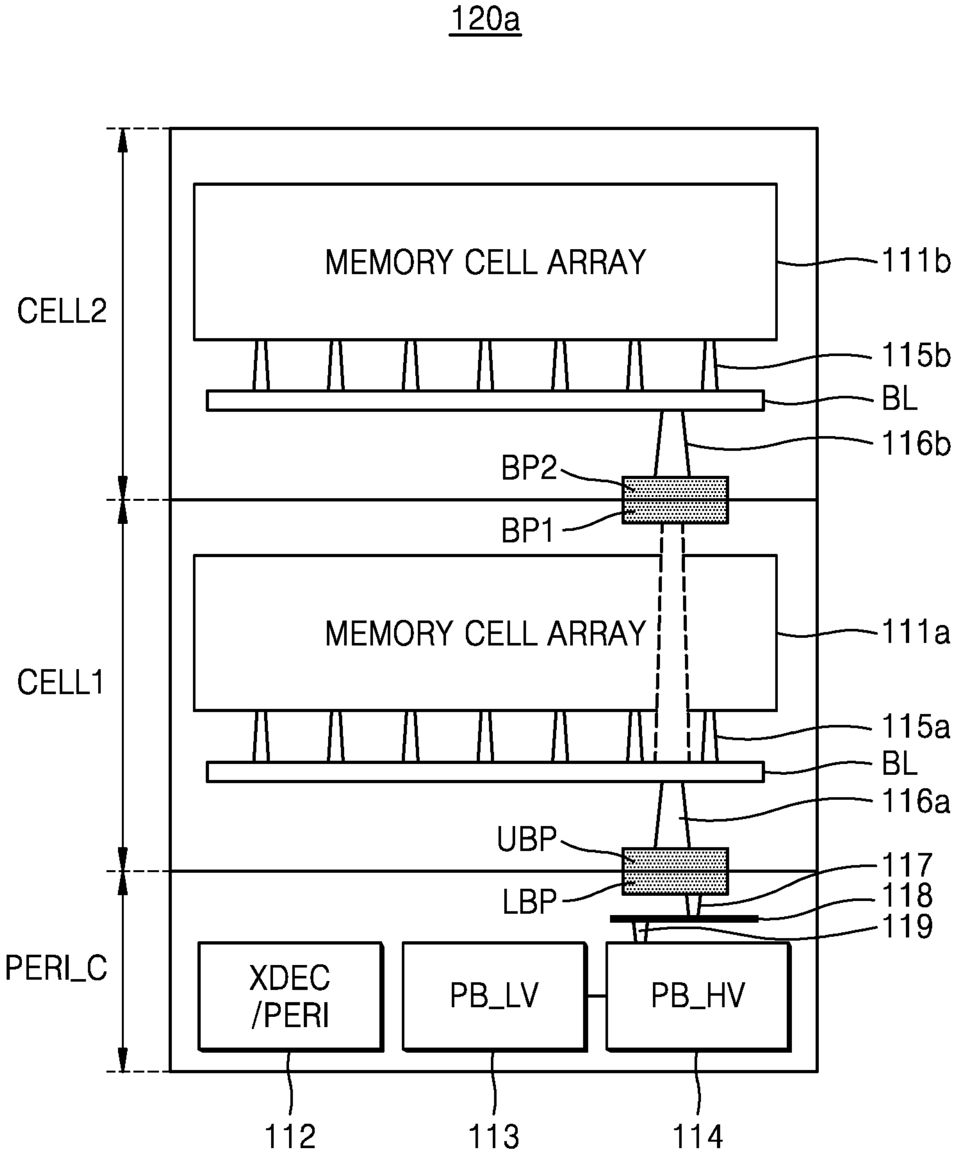
FIG. 12A illustrates a memory device according to one or more example embodiments.
Figure 12B:
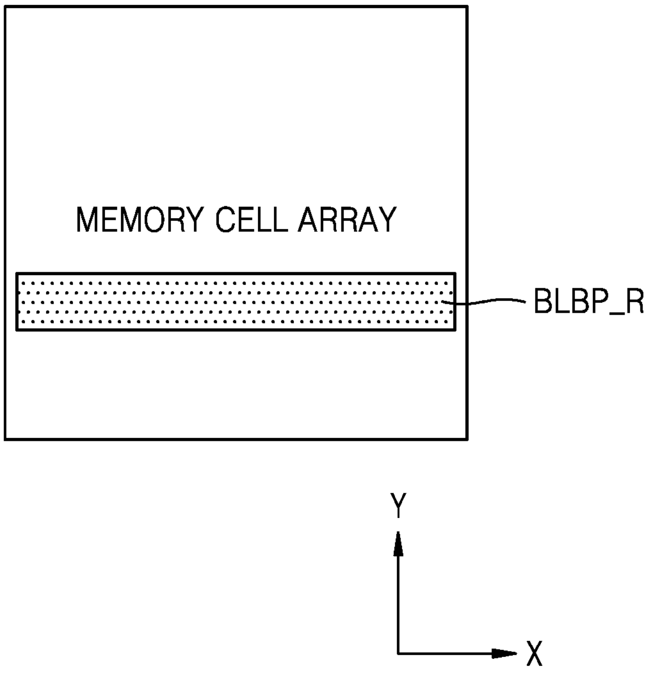
FIG. 12B is a plan view illustrating a memory cell region of FIG. 12A, according to one or more example embodiments.

FIG. 12A illustrates a memory device 120*a* according to one or more example embodiments, and FIG. 12B is a plan view illustrating a memory cell region of FIG. 12A according to one or more example embodiments.

Referring together to FIGS. 12A and 12B, the memory device 120*a* may include a first memory cell region CELL1, a second memory cell region CELL2, and the peripheral circuit region PERI_C. According to one or more example embodiments, the first memory cell region CELL1 may be formed in a first wafer, a second memory cell region CELL2 may be formed in a second wafer, and the peripheral circuit region PERI_C may be formed in a third wafer. The second memory cell region CELL2 may be arranged vertically above the first memory cell region CELL1, and the peripheral circuit region PERI_C may be arranged vertically under the first memory cell region CELL1.

The first memory cell region CELL1 may include a first memory cell array 111*a*, the upper bonding pad UBP, and a bonding pad BP1. In the first memory cell region CELL1, the upper bonding pad UBP may be connected to the bit line BL through a via 116*a*, and the bit line BL may be connected to the first memory cell array 111*a* through a via 115*a*. In the first memory cell region CELL1, the bit line bonding pad region BLBP_R, in which the upper bonding pads UBP are arranged, may be a region corresponding to the high-voltage page buffer circuit 114 of the peripheral circuit region PERI_C.

The second memory cell region CELL2 may include a second memory cell array 111*b* and a bonding pad BP2. In the second memory cell region CELL2, the bonding pad BP2 may be connected to the bit line BL through a via 116*b*, and the bit line BL may be connected to the second memory cell array 111*b* through a via 115*b*. The bonding pad BP2 of the second memory cell region CELL2 may be connected with the bonding pad BP1 of the first memory cell region CELL1 in a bonding manner, and thus, the bonding pad BP2 of the second memory cell region CELL2 may be connected to the upper bonding pad UBP of the first memory cell region CELL1.

The peripheral circuit region PERI_C may include the row decoder/peripheral circuit 112, the low-voltage page buffer circuit 113, the high-voltage page buffer circuit 114, and the lower bonding pad LBP. In the peripheral circuit region PERI_C, the lower bonding pad LBP may be connected to the high-voltage page buffer circuit 114. For example, the lower bonding pad LBP may be connected to the high-voltage page buffer circuit 114 through the vias 117 and 119 and the lower metal layer 118. According to one or more example embodiments, the low-voltage page buffer circuit 113 may include respective low-voltage regions (for example, LV of FIG. 15) of a plurality of page buffers (for example, PB of FIG. 1), which are included in a page buffer circuit, and the high-voltage page buffer circuit 114 may include respective high-voltage regions (for example, HV of FIG. 15) of the plurality of page buffers, which are included in the page buffer circuit.

Figure 13:
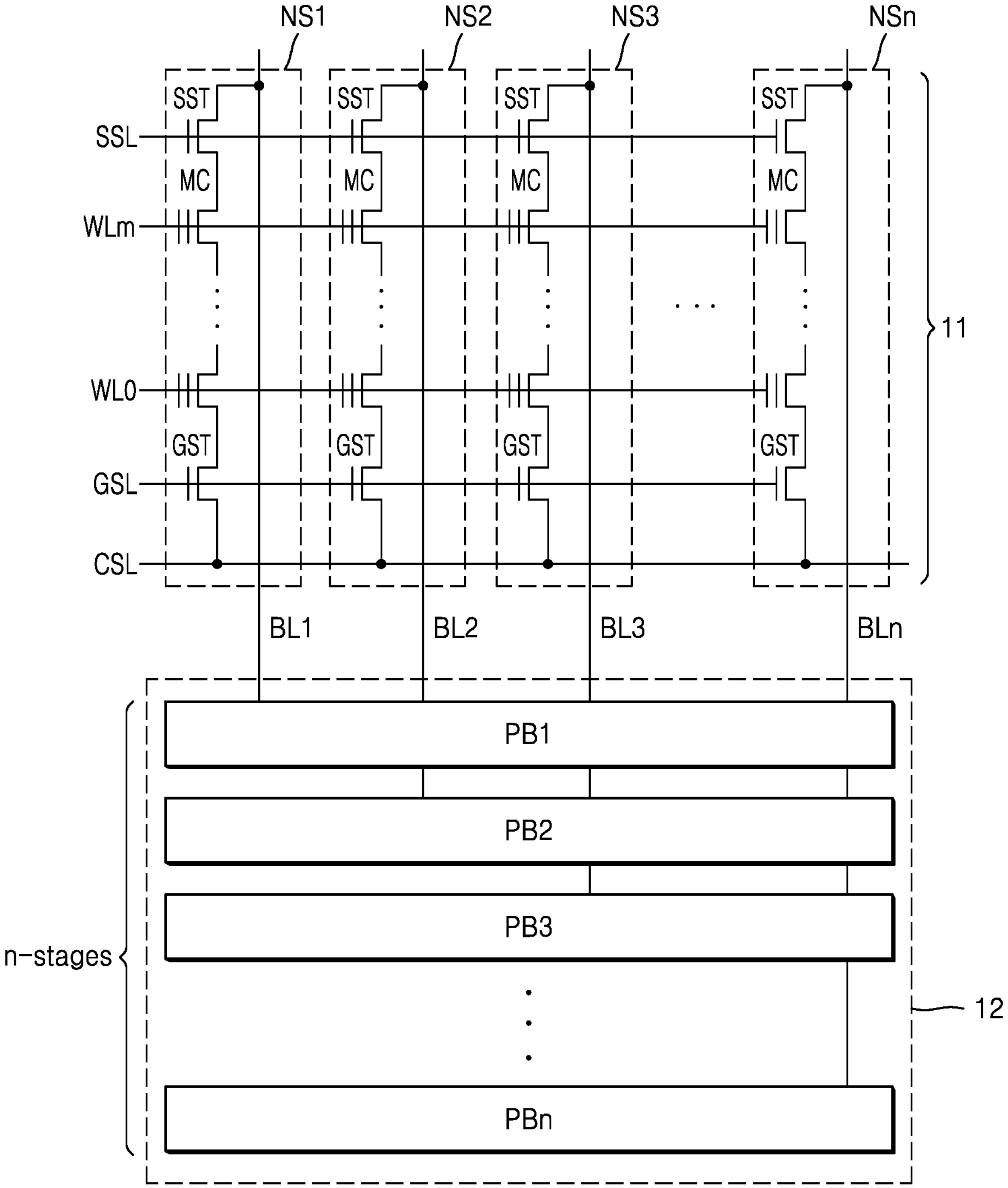
FIG. 13 illustrates a memory cell array and a page buffer circuit, according to one or more example embodiments.

FIG. 13 illustrates the memory cell array 11 and the page buffer circuit 12, according to one or more example embodiments.

Referring to FIG. 13, the memory cell array 11 may include first to n-th NAND strings NS1 to NSn, and each of the first to n-th NAND strings NS1 to NSn may include a ground select transistor GST connected to a ground select line GSL, a plurality of memory cells MC respectively connected to a plurality of word lines WL0 to WLm, and a string select transistor SST connected to a string select line SSL. In addition, the ground select transistor GST, the plurality of memory cells MC, and the string select transistor SST may be connected in series with each other. According to one or more example embodiments, n and m are each a positive integer.

The page buffer circuit 12 may have a multi-stage structure including first to n-th page buffers PB1 to PBn. The first page buffer PB1 may be connected to the first NAND string through a first bit line BL1, and the n-th page buffer PBn may be connected to the n-th NAND string NSn through an n-th bit line BLn. According to one or more example embodiments, n is a positive integer. For example, the first to n-th page buffers PB1 to PBn may be arranged in a line in an extension direction of the first to n-th bit lines BL1 to BLn.

Figure 14:
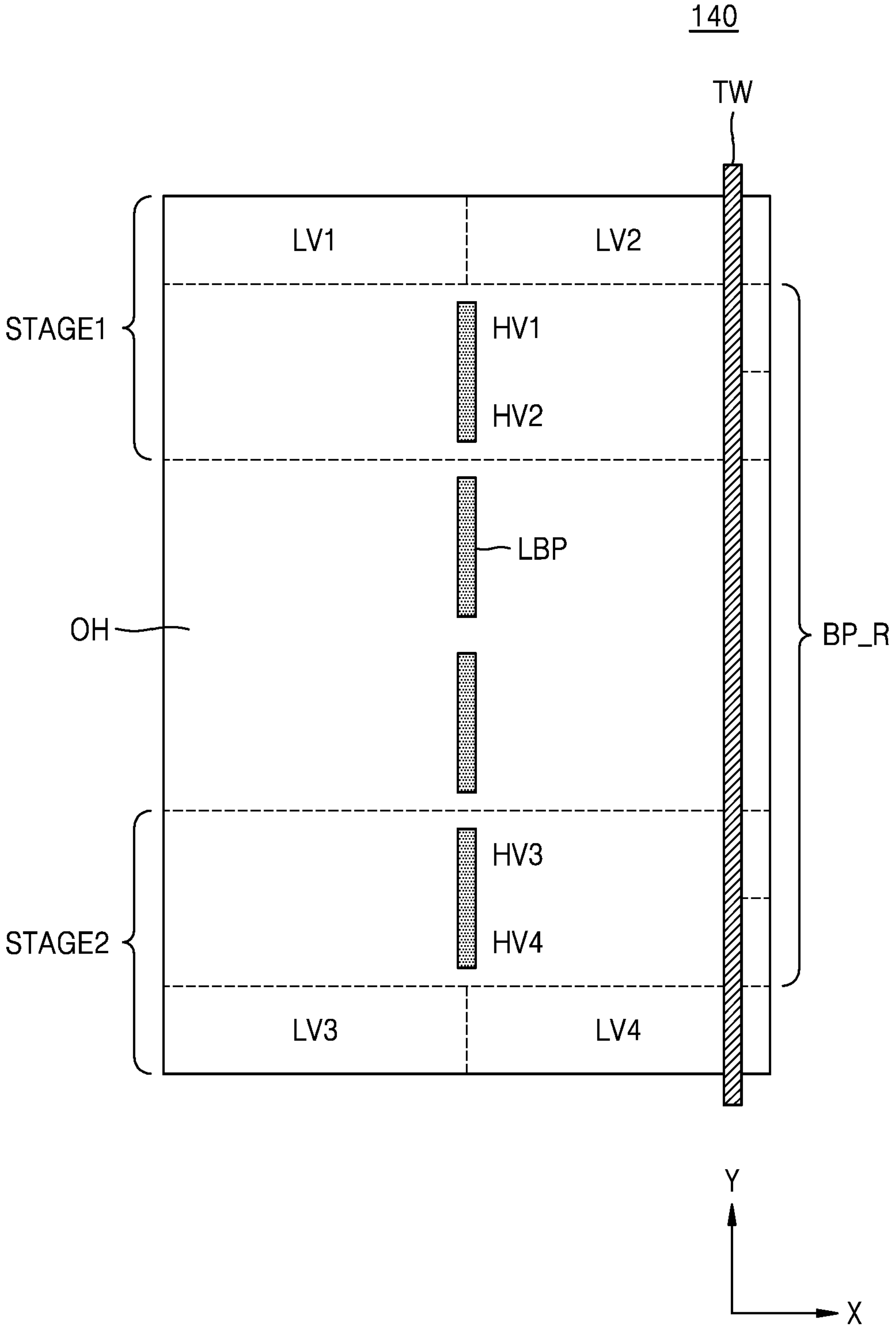
FIG. 14 is a plan view schematically illustrating a page buffer circuit according to one or more example embodiments.

FIG. 14 is a plan view schematically illustrating a page buffer circuit 140 according to one or more example embodiments.

Referring to FIG. 14, the page buffer circuit 140 may have a multi-stage structure and may correspond to, for example, one or more example embodiments of the page buffer circuit 12 of FIG. 13. A first stage STAGE1 may include first and second low-voltage regions LV1 and LV2 and first and second high-voltage regions HV1 and HV2. The first and second low-voltage regions LV1 and LV2 may be adjacent to each other in the second direction (X direction) and may be isolated from each other by, for example, a device isolation film, such as shallow trench isolation (STI). The first and second high-voltage regions HV1 and HV2 may be adjacent to each other in the first direction (Y direction), and the first high-voltage region HV1 may be adjacent to the first and second low-voltage regions LV1 and LV2 in the first direction (Y direction). For example, the first high-voltage region HV1 may be isolated from the first and second low-voltage regions LV1 and LV2 by the device isolation film. For example, the first low-voltage region LV1 and the first high-voltage region HV1 may constitute a first page buffer, and the second low-voltage region LV2 and the second high-voltage region HV2 may constitute a second page buffer. For example, each of the first and second page buffers may correspond to the page buffer PB of FIG. 1.

A second stage STAGE2 may include third and fourth high-voltage regions HV3 and HV4 and third and fourth low-voltage regions LV3 and LV4. The third and fourth low-voltage regions LV3 and LV4 may be adjacent to each other in the second direction (X direction) and may be isolated from each other by the device isolation film. The third and fourth high-voltage regions HV3 and HV4 may be adjacent to each other in the first direction (Y direction), and the fourth high-voltage region HV4 may be adjacent to the third and fourth low-voltage regions LV3 and LV4 in the first direction (Y direction). For example, the fourth high-voltage region HV4 may be isolated from the third and fourth low-voltage regions LV3 and LV4 by the device isolation film. For example, the third low-voltage region LV3 and the third high-voltage region HV3 may constitute a third page buffer, and the fourth low-voltage region LV4 and the fourth high-voltage region HV4 may constitute a fourth page buffer. For example, each of the third and fourth page buffers may correspond to the page buffer PB of FIG. 1.

In one or more example embodiments, the lower bonding pads LBP may be arranged in a line in the first direction (Y direction) in a bonding pad region BP_R of the page buffer circuit 140. For example, the number of lower bonding pads LBP may be 4 in correspondence with the first to fourth high-voltage regions HV1 to HV4. For example, the bonding pad region BP_R may include the first to fourth high-voltage regions HV1 to HV4 of the page buffer circuit 140 and an overhead region OH. However, one or more example embodiments are not limited thereto, and in another one or more example embodiments, the bonding pad region BP_R may include the overhead region OH, and all the lower bonding pads LBP may be arranged in the overhead region OH. In yet another example, the bonding pad region BP_R may include the first to fourth high-voltage regions HV1 to HV4, and the lower bonding pads LBP may be arranged in the first to fourth high-voltage regions HV1 to HV4.

In one or more example embodiments, a through-electrode TW may extend in the first direction (Y direction) above the page buffer circuit 140. For example, the through-electrode TW may cross the second and fourth low-voltage regions LV2 and LV4 and the first to fourth high-voltage regions HV1 to HV4 of the page buffer circuit 140. However, one or more example embodiments are not limited thereto, and the through-electrode TW may cross the first and third low-voltage regions LV1 and LV3 and the first to fourth high-voltage regions HV1 to HV4 of the page buffer circuit 140.

Figure 15:
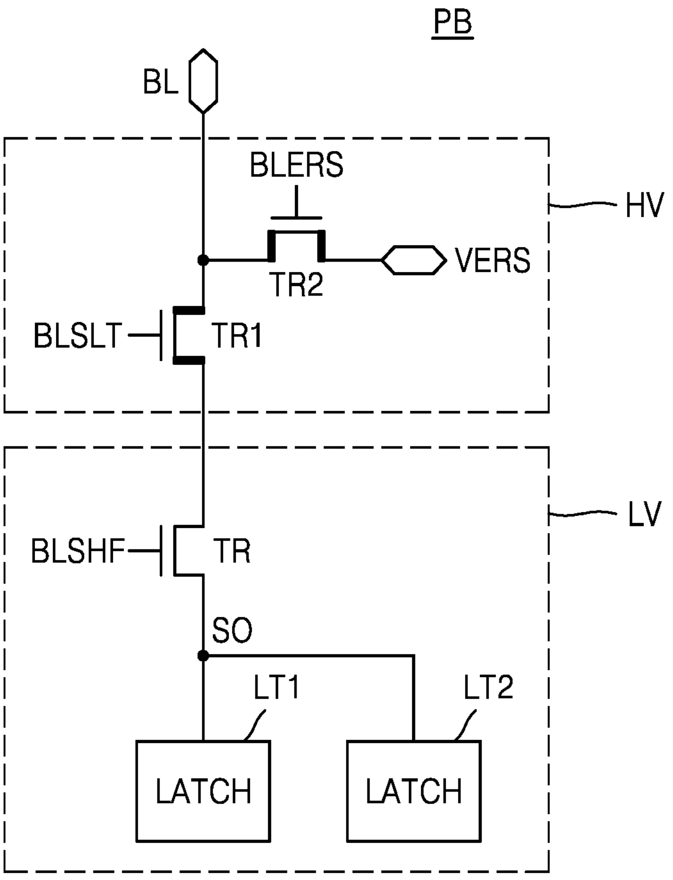
FIG. 15 is a circuit diagram illustrating a page buffer according to one or more example embodiments.

FIG. 15 is a circuit diagram illustrating a page buffer PB according to one or more example embodiments.

Referring to FIG. 15, the page buffer PB may correspond to one or more example embodiments of the page buffer PB of FIG. 1 and may also correspond to one of the first to fourth page buffers of FIG. 14. The page buffer PB may include a high-voltage region HV and a low-voltage region LV. The high-voltage region HV may include a high-voltage transistor TR1, for example, a bit line select transistor TR1, which is connected to the bit line BL and driven by a bit line select signal BLSLT. In addition, the high-voltage region HV may further include a high-voltage transistor TR2, that is, an erase transistor TR2, which is connected between the bit line BL and an erase voltage line VERS and driven by an erase control signal BLERS. For example, the high-voltage transistors TR1 and TR2 may operate in a high-voltage range of about 2 V to about 28 V. For example, the high-voltage region HV may be arranged in a first well region.

The low-voltage region LV may include a transistor TR, for example, a bit line shut-off transistor TR, which is connected between a sensing node SO and the high-voltage transistor TR1 and driven by a bit line shut-off signal BLSHF. In addition, the low-voltage region LV may further include a plurality of latches LT1 and LT2 connected to the sensing node SO. For example, the plurality of latches LT1 and LT2 may include a sensing latch, a force latch, an upper bit latch, a lower bit latch, a cache latch, or the like. In addition, the low-voltage region LV may further include a pre-charge circuit capable of controlling a pre-charge operation on the bit line BL or the sensing node SO. For example, the low-voltage region LV may be arranged in a second well region that is separated from the first well region.

Figure 16:
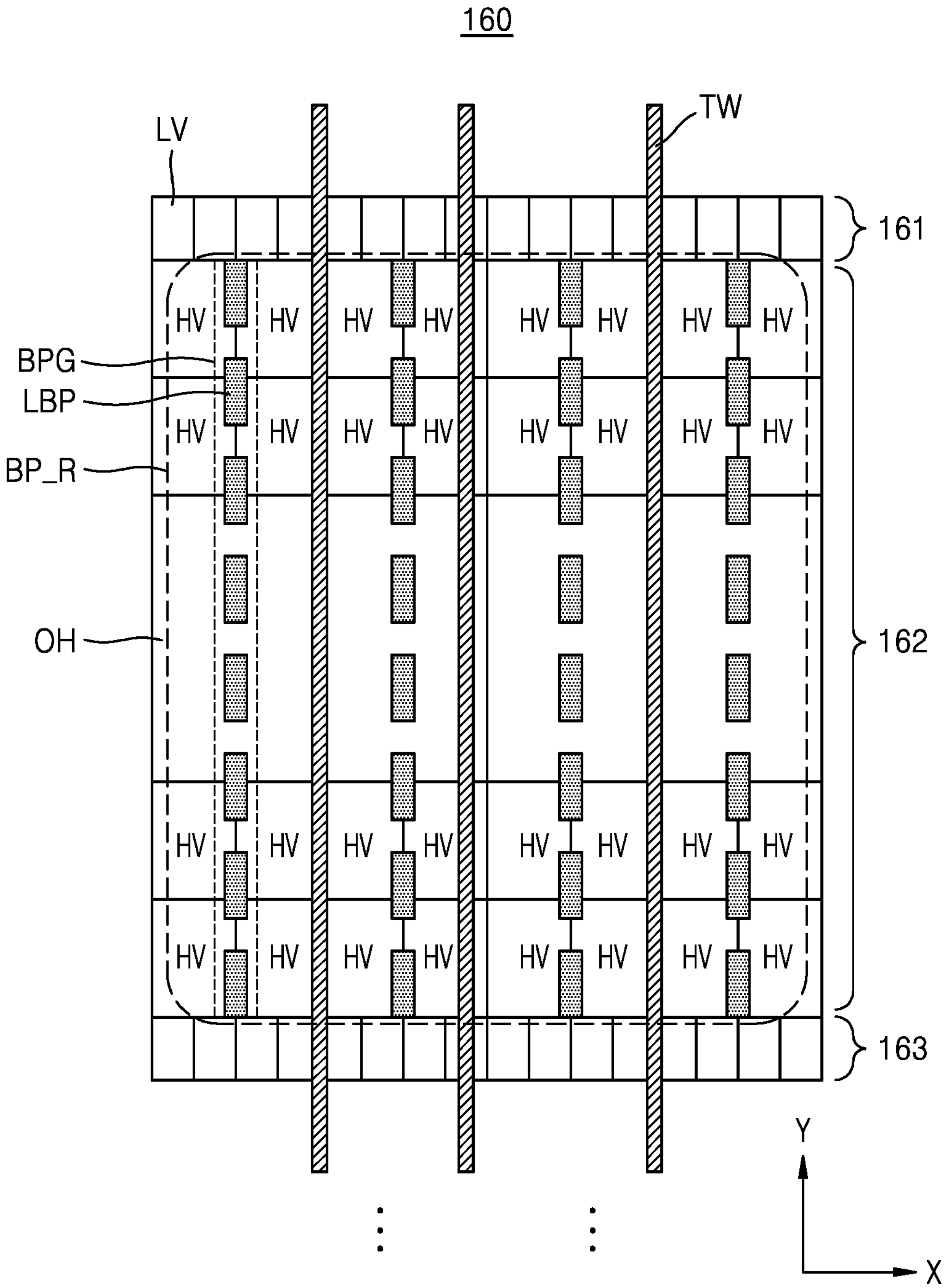
FIG. 16 is a plan view schematically illustrating a page buffer circuit according to one or more example embodiments.

FIG. 16 is a plan view schematically illustrating a page buffer circuit 160 according to one or more example embodiments.

Referring to FIG. 16, the page buffer circuit 160 may include first, second, and third regions 161, 162, and 163. The first region 161 may include a plurality of low-voltage regions LV arranged in a line in the second direction (X direction), and the third region 163 may include the plurality of low-voltage regions LV arranged in a line in the second direction (X direction). For example, according to one or more example embodiments, each low-voltage region LV may correspond to the low-voltage region LV of FIG. 15. The second region 162 may include a plurality of high-voltage regions HV and the overhead region OH. In one or more example embodiments, the plurality of lower bonding pads LBP may be arranged in the second region 162, and thus, the second region 162 may be referred to as a bit line bonding pad region or the bonding pad region BP_R.

The plurality of lower bonding pads LBP may be grouped into a plurality of bonding pad groups BPG, and at least one through-wiring line TW may be arranged between adjacent bonding pad groups from among the plurality of bonding pad groups BPG. Therefore, in the second region 162, the bonding pad groups BPG and the through-wiring lines TW may be alternately arranged in the second direction (X direction). For example, each bonding pad group BPG may include eight lower bonding pads LBP arranged in a line in the first direction (Y direction). According to one or more example embodiments, the eight lower bonding pads LBP may be respectively connected to eight high-voltage regions HV. For example, the eight lower bonding pads LBP may be connected to the eight high-voltage regions HV through lower metal layers and lower metal contacts, respectively.

Figure 17:
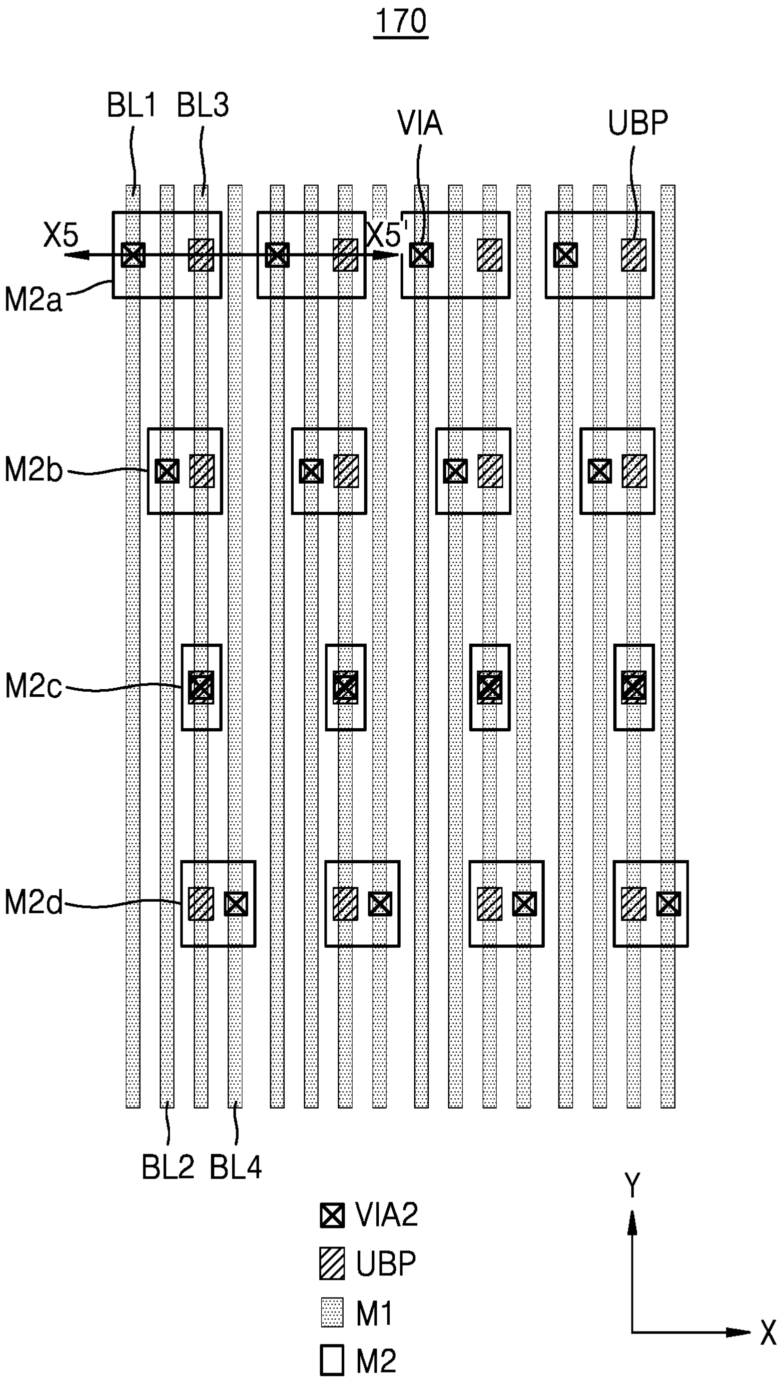
FIG. 17 is a plan view illustrating a memory cell region according to one or more example embodiments.
Figure 18:
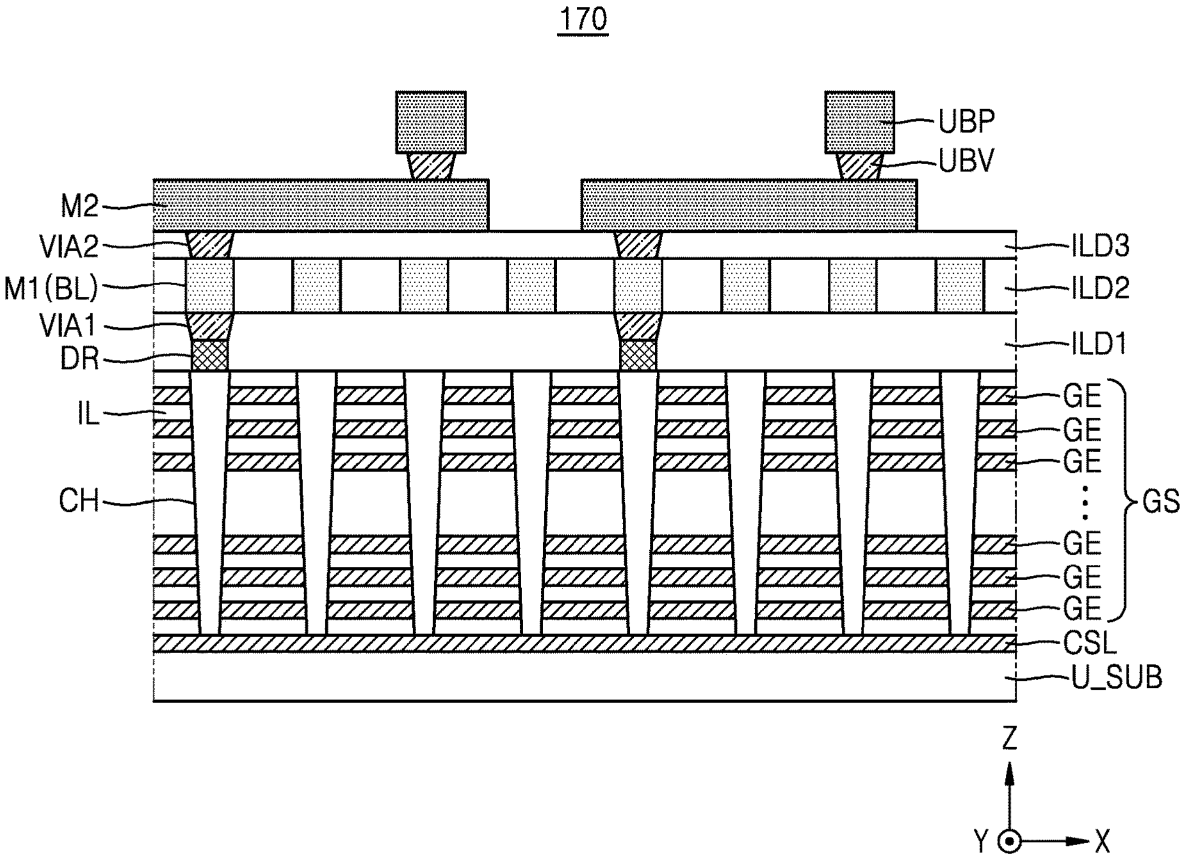
FIG. 18 is a cross-sectional view of the memory cell region, taken along a line X5-X5' of FIG. 17, according to one or more example embodiments.

FIG. 17 is a plan view illustrating a memory cell region 170 according to one or more example embodiments. FIG. 18 is a cross-sectional view of the memory cell region 170, taken along a line X5-X5' of FIG. 17, according to one or more example embodiments.

Referring together to FIGS. 17 and 18, the memory cell region 170 may correspond to, for example, the memory cell region 31 of FIG. 3, the first semiconductor chip 41 of FIG. 4, the memory cell region CELL of FIG. 11A, or the first memory cell region CELL1 of FIG. 12A. The memory cell region 170 may include an upper substrate U_SUB, a common source line CSL, a gate structure GS, channel structures CH, an insulating layer IL, interlayer dielectrics ILD1, ILD2, and ILD3, first and second metal layers M1 and M2, first and second vias VIA1 and VIA2, upper bonding vias UBV, and upper bonding pads UBP.

The upper substrate U_SUB may be implemented by polysilicon, and the common source line CSL may be formed in a plate shape by doping the upper substrate U_SUB with impurities. Depending on one or more example embodiments, the upper substrate U_SUB may be defined as including a plate common source line CSL. The gate structure GS may include a plurality of gate electrodes GE stacked in the vertical direction (Z direction), and the insulating layer IL may be arranged between adjacent gate electrodes GE. The channel structures CH may extend in the vertical direction (Z direction) on the upper substrate U_SUB or the common source line CSL.

The first and second metal layers M1 and M2, the upper bonding vias UBV, and the upper bonding pads UBP may each comprise a metal material, for example, one selected from the group consisting of copper (Cu), aluminum (Al), tungsten (W), titanium (Ti), titanium nitride (TiN), tungsten nitride (WN), tantalum (Ta), tantalum nitride (TaN), and titanium aluminum nitride (TiAlN), or a combination thereof. Each of the first and second vias VIA1 and VIA2 may include a conductive material, for example, doped polysilicon, aluminum (Al), tungsten (W), copper (Cu), titanium (Ti), or the like.

According to one or more example embodiments, the first metal layer M1 may include the bit lines BL, which each extend in the first direction (Y direction) and are apart from each other in the second direction (X direction). In one or more example embodiments, the bit lines BL may be respectively connected to the channel structures CH through the first via VIA1 and a drain DR, which correspond thereto. In addition, the bit lines BL may be respectively connected to the upper bonding pads UBP through the second via VIA2, the second metal layer M2, and the upper bonding vias UBV, which correspond thereto.

For example, the bit lines BL may include first to fourth bit lines BL1 to BL4. The first to fourth bit lines BL1 to BL4 may be connected to second metal layers M2 (that is, M2*a* to M2*d*) through second vias VIA2 corresponding thereto, respectively. In addition, the second metal layers M2*a* to M2*d* may be connected to the upper bonding pads UBP through the upper bonding vias UBV, respectively. As such, according to one or more example embodiments, the upper bonding pads UBP may be arranged in a line in the first direction (Y direction) and thus be respectively connected to the lower bonding pads LBP corresponding thereto. According to one or more example embodiments, the plurality of bit lines BL arranged in the second direction (X direction) may be respectively connected to the upper bonding pads UBP through the second metal layers M2 extending in the second direction (X direction).

Figure 19:
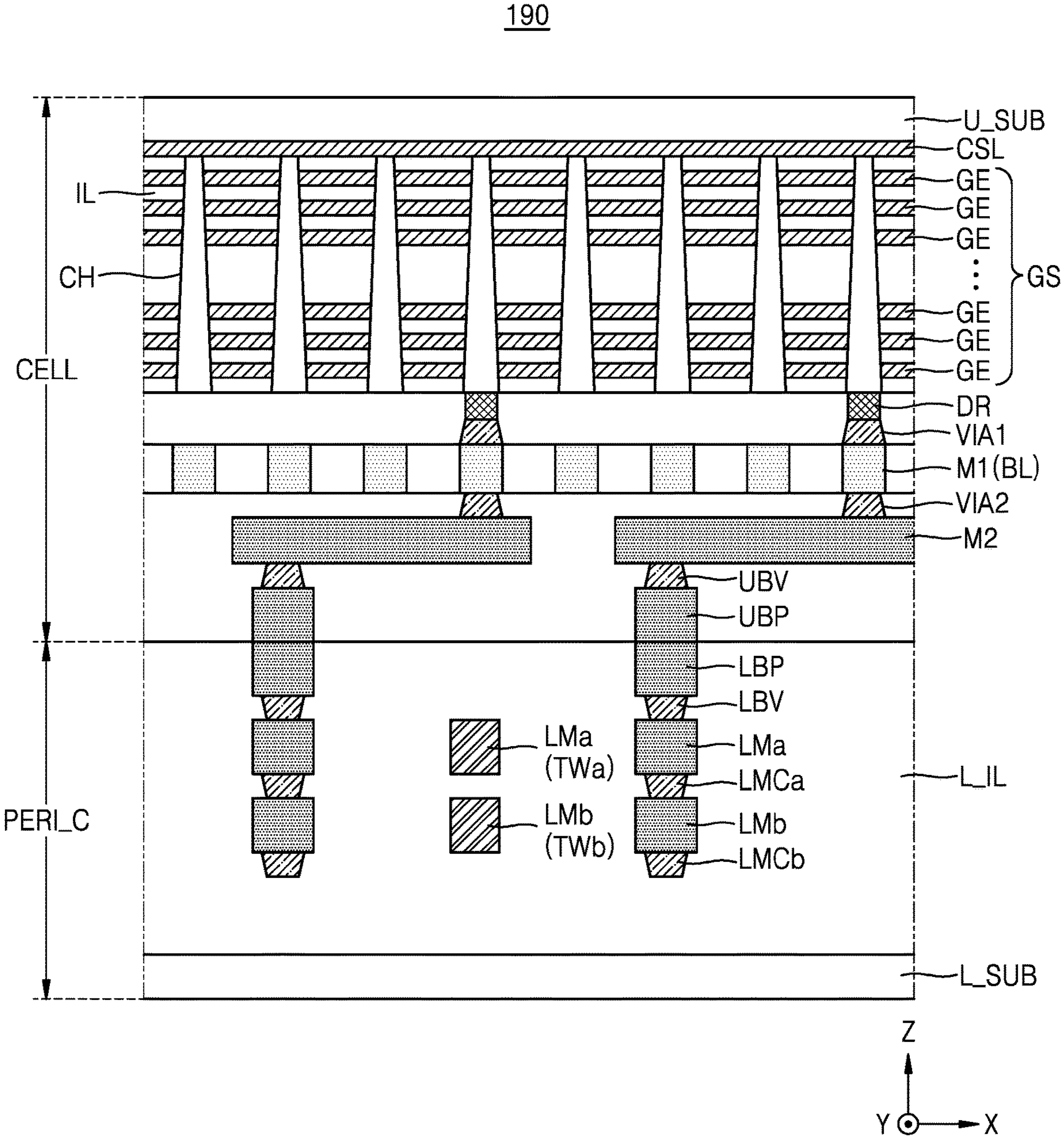
FIG. 19 is a cross-sectional view illustrating a memory device according to one or more example embodiments.

FIG. 19 is a cross-sectional view illustrating a memory device 190 according to one or more example embodiments.

Referring to FIG. 19, the memory device 190 may include the memory cell region CELL and the peripheral circuit region PERI_C and, for example, the memory cell region CELL may correspond to the memory cell region 170 of FIG. 18. The peripheral circuit region PERI_C may include a lower substrate L_SUB, lower metal layers LMa and LMb, lower metal contacts LMCa and LMCb, a lower insulating layer L_IL, lower bonding vias LBV, and lower bonding pads LBP. A plurality of circuit elements, for example, a plurality of transistors, may be arranged on the lower substrate L_SUB. The number of lower metal layers, which are included in the peripheral circuit region PERI_C, may be variously modified depending on one or more example embodiments.

In one or more example embodiments, the peripheral circuit region PERI_C may further include a first through-wiring line TWa and a second through-wiring line TWb, which each extend in the first direction (Y direction) and are apart from each other in the vertical direction (Z direction). The first through-wiring line TWa may be implemented by the lower metal layer LMa, and the second through-wiring line TWb may be implemented by the lower metal layer LMb. As such, according to one or more example embodiments, the first and second through-wiring lines TWa and TWb may extend in the first direction (Y direction) between the lower bonding pads LBP that are apart from each other in the second direction (X direction). The number of through-wiring lines, which are included in the peripheral circuit region PERI_C, may be variously modified depending on one or more example embodiments.

Figure 20:
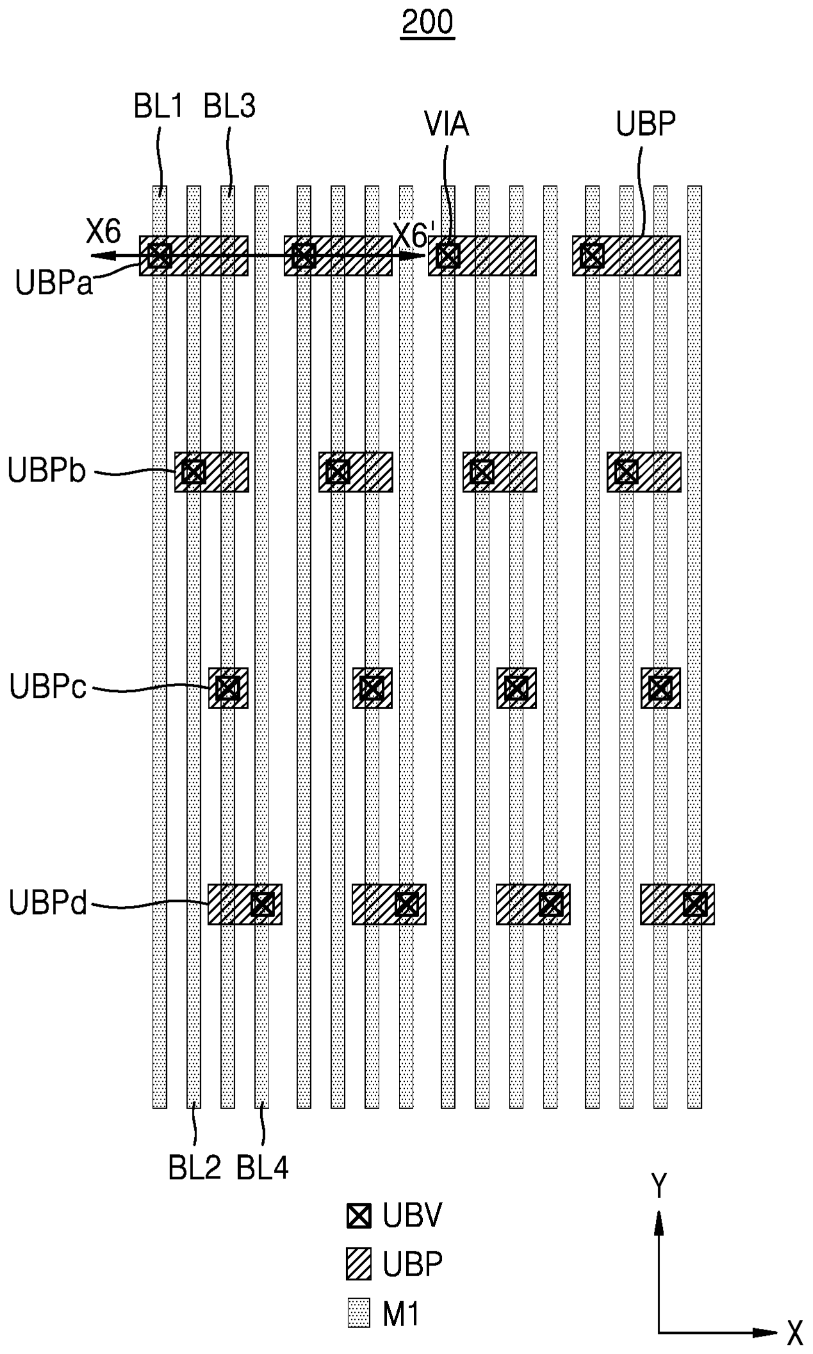
FIG. 20 is a plan view illustrating a memory cell region according to one or more example embodiments.
Figure 21:
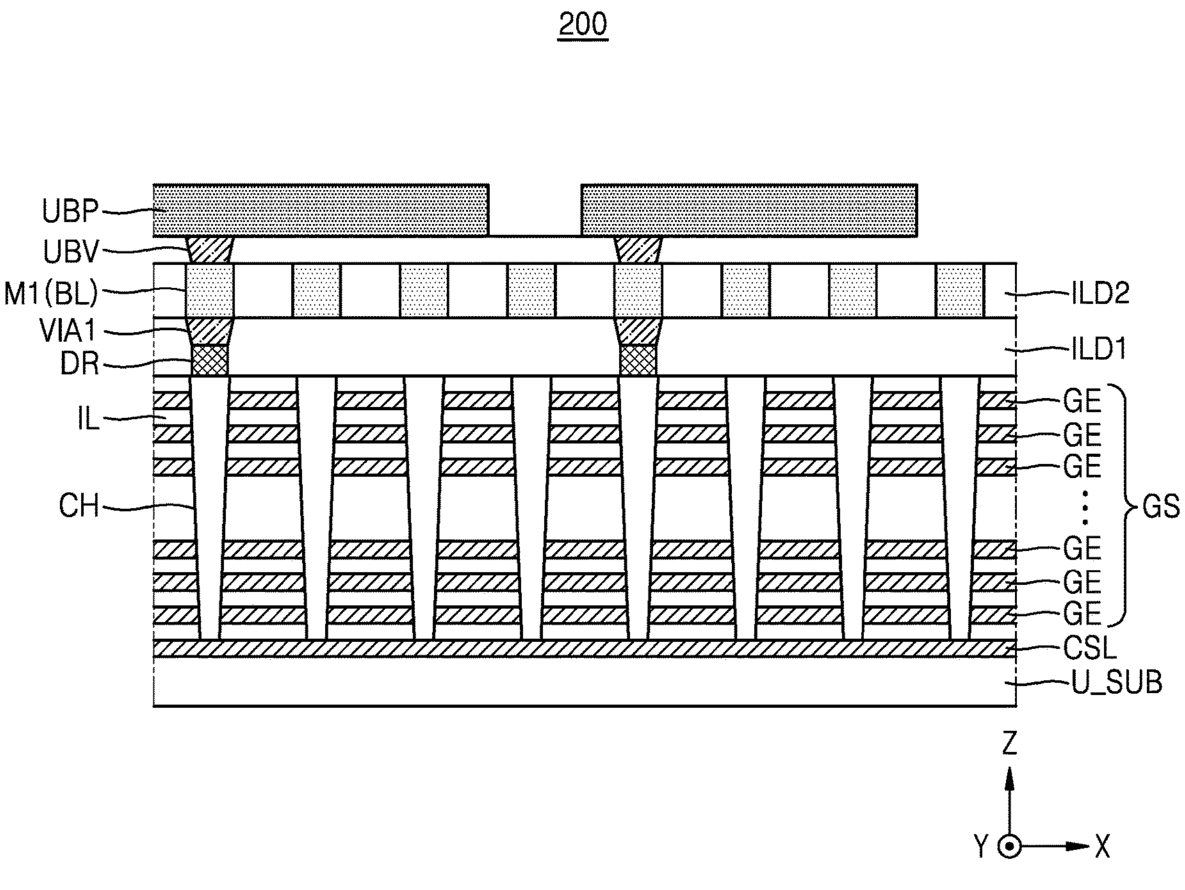
FIG. 21 is a cross-sectional view of the memory cell region, taken along a line X6-X6' of FIG. 20, according to one or more example embodiments.

FIG. 20 is a plan view illustrating a memory cell region 200 according to one or more example embodiments. FIG. 21 is a cross-sectional view of the memory cell region 200, taken along a line X6-X6' of FIG. 20, according to one or more example embodiments.

Referring together to FIGS. 20 and 21, the memory cell region 200 may correspond to, for example, the memory cell region 31 of FIG. 3, the first semiconductor chip 41 of FIG. 4, the memory cell region CELL of FIG. 11A, or the first memory cell region CELL1 of FIG. 12A. In addition, the memory cell region 200 may correspond to a modified one or more example embodiments of the memory cell region 170 of FIG. 17, and duplicate descriptions are omitted. The memory cell region 200 may include the upper substrate U_SUB, the common source line CSL, the gate structure GS, the channel structures CH, the insulating layer IL, the interlayer dielectrics ILD1 and ILD2, the first metal layer M1, the first via VIA1, the upper bonding via UBV, and the upper bonding pads UBP.

According to one or more example embodiments, the first metal layer M1 may include the bit lines BL, which each extend in the first direction (Y direction) and are apart from each other in the second direction (X direction). In one or more example embodiments, the bit lines BL may be respectively connected to the channel structures CH through the first via VIA1 and the drain DR, which correspond thereto. In addition, the bit lines BL may be respectively connected to the upper bonding pads UBP through the upper bonding via UBV corresponding thereto.

For example, the bit lines BL may include the first to fourth bit lines BL1 to BL4. According to one or more example embodiments, the first to fourth bit lines BL1 to BL4 may be respectively connected to upper bonding pads UBP (that is, UBPa to UBPd) through the upper bonding via UBV corresponding thereto. According to one or more example embodiments, the upper bonding pads UBPa to UBPd may be respectively implemented by metal patterns extending in the second direction (X direction), and the respective sizes of the upper bonding pads UBPa to UBPd in the second direction (X direction) may be different from each other. As such, the plurality of bit lines BL arranged in the second direction (X direction) may be respectively connected to the upper bonding pads UBP extending in the second direction (X direction), without going through the second metal layer M2, unlike FIG. 17.

FIG. 22 is a cross-sectional view illustrating a memory device 220 according to one or more example embodiments.

Referring to FIG. 22, the memory device 220 may include the memory cell region CELL and the peripheral circuit region PERI_C, and the memory cell region CELL may correspond to, for example, the memory cell region 200 of FIG. 20. The peripheral circuit region PERI_C may include the lower substrate L_SUB, the lower metal layers LMa and LMb, the lower metal contacts LMCa and LMCb, the lower insulating layer L_IL, the lower bonding vias LBV, and the lower bonding pads LBP. A plurality of circuit elements, for example, a plurality of transistors, may be arranged on the lower substrate L_SUB. The number of lower metal layers, which are included in the peripheral circuit region PERI_C, may be variously modified depending on one or more example embodiments.

In one or more example embodiments, the peripheral circuit region PERI_C may further include the first through-wiring line TWa and the second through-wiring line TWb, which each extend in the first direction (Y direction) and are apart from each other in the vertical direction (Z direction). The first through-wiring line TWa may be implemented by the lower metal layer LMa, and the second through-wiring line TWb may be implemented by the lower metal layer LMb. As such, according to one or more example embodiments, the first and second through-wiring lines TWa and TWb may extend in the first direction (Y direction) between the lower bonding pads LBP that are apart from each other in the second direction (X direction). The number of through-wiring lines, which are included in the peripheral circuit region PERI_C, may be variously modified depending on one or more example embodiments.

In one or more example embodiments, the lower bonding pads LBP may have the same size in the second direction (X direction), and the upper bonding pads UBP may have different sizes from each other in the second direction (X direction). However, one or more example embodiments are not limited thereto, and in one or more example embodiments, the lower bonding pads LBP may have the same size in the first direction (Y direction), and the upper bonding pads UBP may have different sizes from each other in the first direction (Y direction).

FIG. 23 is a view illustrating a memory device 500 according to one or more example embodiments.

Referring to FIG. 23, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may comprise aluminum (Al) or tungsten (W).

The memory device 500 may include the at least one upper chip including the cell region. For example, as illustrated in FIG. 23, the memory device 500 may include two upper chips. However, the number of the upper chips are not limited thereto. In one or more example embodiments in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. According to one or more example embodiments, upper and lower portions of each of the first and second upper chips will be defined based on a time before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 23. However, one or more example embodiments are not limited thereto. In one or more example embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may comprise at least one of various conductive materials. For example, the first metal lines 230*a*, 230*b* and 230*c* may comprise tungsten having a relatively high electrical resistivity, and the second metal lines 240*a*, 240*b* and 240*c* may comprise copper having a relatively low electrical resistivity.

The first metal lines 230*a*, 230*b* and 230*c* and the second metal lines 240*a*, 240*b* and 240*c* are illustrated and described with reference to one or more example embodiments. However, one or more example embodiments are not limited thereto. In one or more example embodiments, at least one or more additional metal lines may further be formed on the second metal lines 240*a*, 240*b* and 240*c*. In this case, according to one or more example embodiments, the second metal lines 240*a*, 240*b* and 240*c* may comprise aluminum, and at least some of the additional metal lines formed on the second metal lines 240*a*, 240*b* and 240*c* may comprise copper having an electrical resistivity lower than that of aluminum of the second metal lines 240*a*, 240*b* and 240*c*.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may comprise at least one of various materials and may comprise, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In one or more example embodiments, as illustrated in a region A1, the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In one or more example embodiments, as illustrated in a region A2, the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 500 according to one or more example embodiments may include a channel having improved width uniformity due to the lower channel LCH and the upper channel UCH which are formed by the processes performed sequentially.

In one or more example embodiments in which the channel structure CH includes the lower channel LCH and the upper channel UCH as illustrated in the region A2, a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, according to one or more example embodiments, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH during an operation of the memory device.

Meanwhile, the number of the lower word lines 331 and 332 penetrated by the lower channel LCH is less than the number of the upper word lines 333 to 338 penetrated by the upper channel UCH in the region A2. However, one or more example embodiments are not limited thereto. In one or more example embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 23, the first through-electrode THV1 may penetrate the common source line 320 and the plurality of word lines 330. In one or more example embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In one or more example embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring to FIG. 23, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected to the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In one or more example embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may comprise aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may comprise a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 23, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/ output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In one or more example embodiments, the third substrate 410 may not be disposed in a region in which the input/output contact plug is disposed. For example, as illustrated in a region B, the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, according to one or more example embodiments, the third input/output contact plug 404 may be formed by at least one of various processes.

In one or more example embodiments, as illustrated in a region B1, the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region A1 may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In one or more example embodiments, as illustrated in a region B2, the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In one or more example embodiments, the input/output contact plug may overlap with the third substrate 410. For example, as illustrated in a region C, the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, according to one or more example embodiments, a connection structure of the second input/output contact plug 403 and the second input/output pad 405 may be realized by various methods according to one or more example embodiments.

In one or more example embodiments, as illustrated in a region C1, an opening 408 may be formed to penetrate the third substrate 410, and the second input/output contact plug 403 may be connected directly to the second input/output pad 405 through the opening 408 formed in the third substrate 410. In this case, according to one or more example embodiments, as illustrated in the region C1, a diameter of the second input/output contact plug 403 may become progressively greater toward the second input/output pad 405. However, one or more example embodiments are not limited thereto, and in one or more example embodiments, the diameter of the second input/output contact plug 403 may become progressively less toward the second input/output pad 405.

In one or more example embodiments, as illustrated in a region C2, the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, according to one or more example embodiments, as illustrated in the region C2, a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In one or more example embodiments illustrated in a region C3, a stopper 409 may further be formed on a bottom end of the opening 408 of the third substrate 410, as compared with one or more example embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

Meanwhile, in one or more example embodiments, a slit 411 may be formed in the third substrate 410. For example, the slit 411 may be formed at a certain position of the external pad bonding region PA. For example, as illustrated in a region D, the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In one or more example embodiments, as illustrated in a region D1, the slit 411 may be formed to penetrate the third substrate 410. For example, the slit 411 may be used to prevent the third substrate 410 from being finely cracked when the opening 408 is formed. However, one or more example embodiments are not limited thereto, and in one or more example embodiments, the slit 411 may be formed to have a depth ranging from about 60% to about 70% of a thickness of the third substrate 410.

In one or more example embodiments, as illustrated in a region D2, a conductive material 412 may be formed in the slit 411. For example, the conductive material 412 may be used to discharge a leakage current to the outside, the discharge occurring in driving of the circuit elements in the external pad bonding region PA. In this case, according to one or more example embodiments, the conductive material 412 may be connected to an external ground line.

In one or more example embodiments, as illustrated in a region D3, an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in one or more example embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In one or more example embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

According to one or more example embodiments, upper bonding metals 270*c* of the peripheral circuit region PERI may be arranged in a matrix form in the first direction (Y direction) and the second direction (X direction) above a page buffer circuit region. The page buffer circuit region may correspond to the bit line bonding region BLBA. For example, the upper bonding metals 270*c* may be grouped into a plurality of bonding pad groups, and each of the plurality of bonding pad groups may include upper bonding metals arranged in a line in the first direction (Y direction). According to one or more example embodiments, the peripheral circuit region PERI may include a plurality of through-wiring lines extending in the first direction (Y direction). For example, each of the plurality of through-wiring lines may be arranged between adjacent bonding pad groups.

Figure 24:
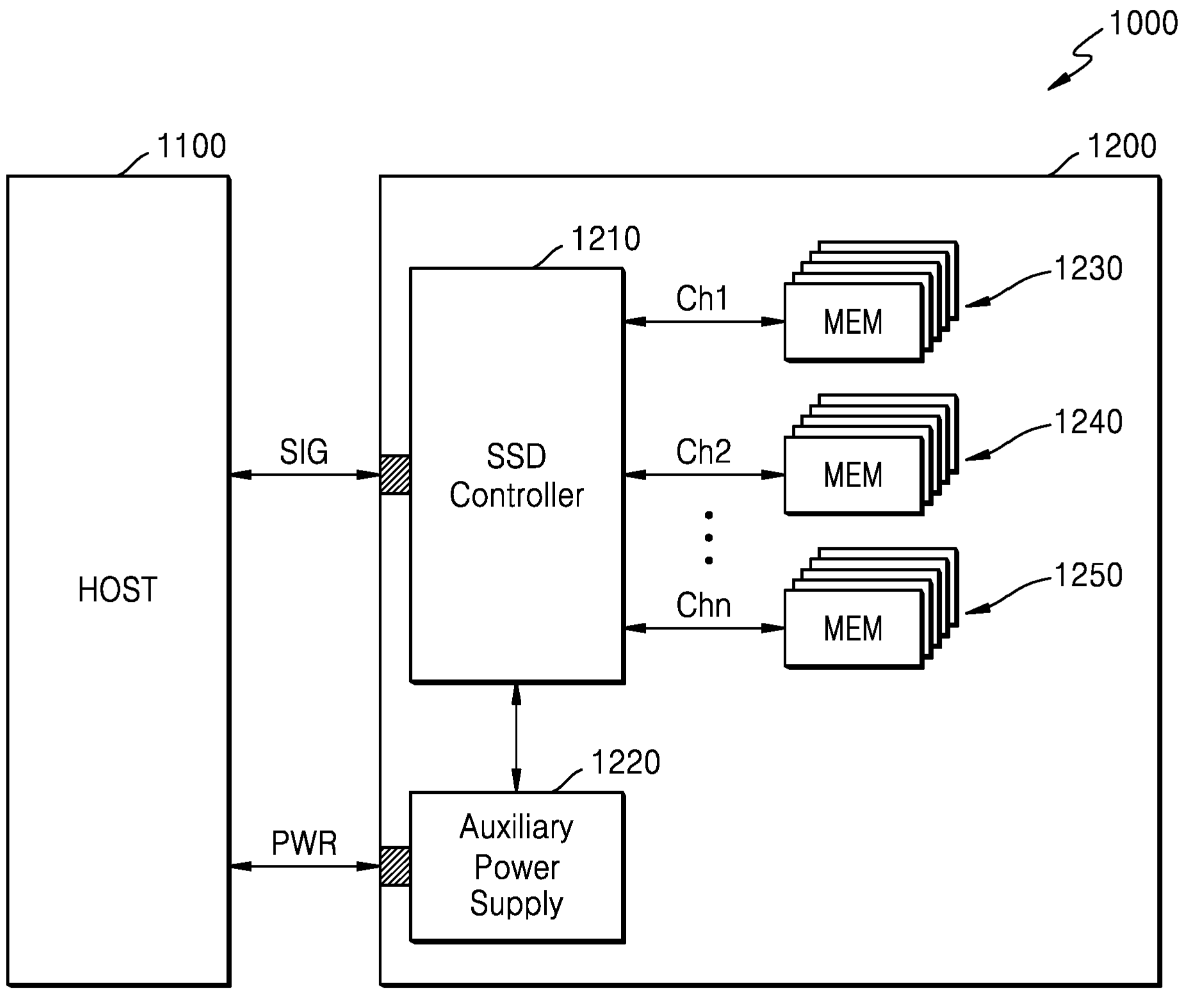
FIG. 24 illustrates a solid-state drive (SSD) including a memory device according to one or more example embodiments.

FIG. 24 is a block diagram illustrating an example in which a memory device according to one or more example embodiments is applied to a solid-state drive (SSD) system 1000.

Referring to FIG. 24, the SSD system 1000 may include a host 1100 and an SSD 1200. The SSD 1200 exchanges signals with the host 1100 through a signal connector and receives power through a power connector. The SSD 1200 may include an SSD controller 1210, an auxiliary power supply 1220, and memory devices 1230, 1240, and 1250. The memory devices 1230, 1240, and 1250 may each include a vertically stacked NAND flash memory device. According to one or more example embodiments, the SSD 1200 may be implemented by using one or more example embodiments described with reference to FIGS. 1, 2, 3, 4, 5, 6A, 6B, 7A, 7B, 8A, 8B, 9A, 9B, 10A, 10B, 11A, 11B, 12A, 12B, 13, 14, 15, 16, 17, 18, 19, 20, 21, 22 and 23.

While one or more example embodiments have been particularly shown and described above, it will be apparent to those skilled in the art that various changes in form and details may be made therein without departing from the spirit and scope of the following claims.

What is claimed is:

1. A non-volatile memory device comprising:

a memory cell region comprising:

a plurality of bit lines each extending in a first direction; and a plurality of upper bonding pads respectively connected to the plurality of bit lines; and a peripheral circuit region comprising:

a page buffer circuit;

a plurality of lower bonding pads provided above the page buffer circuit and respectively connected to the plurality of upper bonding pads; and a plurality of through-wiring lines extending in the first direction, wherein the plurality of lower bonding pads comprises:

first lower bonding pads arranged in a first line extending in the first direction, the first lower bonding pads being included in a first bonding pad group; and second lower bonding pads arranged in a second line extending in the first direction, the second lower bonding pads being included in a second bonding pad group, and wherein the plurality of through-wiring lines comprises at least one first through-wiring line provided above the page buffer circuit, provided below the plurality of lower bonding pads, and extending between the first line and the second line and across the page buffer circuit from a plan view perspective.

2. The non-volatile memory device of claim 1, wherein the peripheral circuit region is connected to the memory cell region by bonding between the plurality of upper bonding pads and the plurality of lower bonding pads.

3. The non-volatile memory device of claim 1, wherein the page buffer circuit comprises a plurality of page buffers respectively corresponding to the plurality of bit lines, and wherein each page buffer of the plurality of page buffers comprises:

a high-voltage region comprising a high-voltage transistor connected to one of the plurality of lower bonding pads; and a low-voltage region comprising a first transistor connected to the high-voltage transistor.

4. The non-volatile memory device of claim 3, wherein each lower bonding pad of the plurality of lower bonding pads is provided above a respective high-voltage region of the high-voltage regions of the plurality of page buffers.

5. The non-volatile memory device of claim 1, wherein the at least one first through-wiring line comprises:

a first wiring line; and a second wiring line which is spaced apart from the first wiring line in a second direction orthogonal to the first direction and is at a same level as the first wiring line.

6. The non-volatile memory device of claim 1, wherein the at least one first through-wiring line comprises:

a first wiring line; and a second wiring line which is spaced apart from the first wiring line in a vertical direction and which is provided at a different level from the first wiring line.

7. The non-volatile memory device of claim 1, wherein the plurality of lower bonding pads further comprises third lower bonding pads arranged in a third line extending in the first direction, the third lower bonding pads being included in a third bonding pad group, and wherein the plurality of through-wiring lines further comprises at least one second through-wiring line extending between the second line and the third line and across the page buffer circuit.

8. The non-volatile memory device of claim 7, wherein the at least one first through-wiring line comprises:

a first wiring line; and a second wiring line which is spaced apart from the first wiring line in a second direction orthogonal to the first direction and is at a same level as the first wiring line, and wherein a width of each of the first wiring line and the second wiring line is less than a width of the at least one second through-wiring line.

9. The non-volatile memory device of claim 1, wherein the peripheral circuit region further comprises:

a peripheral circuit; and a page buffer decoder, wherein the page buffer circuit is provided between the peripheral circuit and the page buffer decoder, and wherein the plurality of through-wiring lines extend from the peripheral circuit to the page buffer decoder.

10. The non-volatile memory device of claim 9, wherein the at least one first through-wiring line comprises at least one of:

a first wiring line configured to transfer a power supply voltage or a ground voltage, which is provided from the peripheral circuit to the page buffer decoder; and a second wiring line configured to transfer a control signal or an output signal between the peripheral circuit and the page buffer decoder.

11. The non-volatile memory device of claim 10, wherein a width of the first wiring line is greater than a width of the second wiring line.

12. A non-volatile memory device comprising:

a first memory cell region comprising:

a first memory cell array provided in a first wafer;

bit lines connected to the first memory cell array and extending in a first direction; and upper bonding pads respectively connected to the bit lines;

a second memory cell region comprising a second memory cell array provided in a second wafer, the second memory cell region being above the first memory cell region in a vertical direction; and a peripheral circuit region comprising:

a page buffer circuit provided in a third wafer;

lower bonding pads respectively connected to the upper bonding pads; and a plurality of through-wiring lines extending in the first direction, wherein the peripheral circuit region is under the first memory cell region in the vertical direction, wherein the lower bonding pads comprise:

first lower bonding pads arranged in a first line extending in the first direction, the first lower bonding pads being included in a first bonding pad group; and second lower bonding pads arranged in a second line extending in the first direction, the second lower bonding pads being included in a second bonding pad group, and wherein the plurality of through-wiring lines comprises at least one first through-wiring line provided above the page buffer circuit, provided below the lower bonding pads, and extending between the first line and the second line and across the page buffer circuit from a plan view perspective.

13. The non-volatile memory device of claim 12, wherein the page buffer circuit comprises page buffers respectively corresponding to the bit lines, and wherein each page buffer of the page buffers comprises:

a high-voltage region comprising a high-voltage transistor connected to one of the lower bonding pads; and a low-voltage region comprising a first transistor connected to the high-voltage transistor.

14. The non-volatile memory device of claim 13, wherein the lower bonding pads are respectively provided above the high-voltage regions of the page buffers.

15. The non-volatile memory device of claim 12, wherein the upper bonding pads are provided in a region corresponding to the page buffer circuit, in the first wafer.

16. The non-volatile memory device of claim 12, wherein the peripheral circuit region further comprises a peripheral circuit and a page buffer decoder, which are provided in the third wafer, wherein the page buffer circuit is provided between the peripheral circuit and the page buffer decoder, and wherein the plurality of through-wiring lines extend from the peripheral circuit to the page buffer decoder.

17. The non-volatile memory device of claim 16, wherein the at least one first through-wiring line comprises at least one of:

a first wiring line configured to transfer a power supply voltage or a ground voltage, which is provided from the peripheral circuit to the page buffer decoder; and a second wiring line configured to transfer a control signal or an output signal between the peripheral circuit and the page buffer decoder.

18. A non-volatile memory device comprising:

a memory cell region comprising:

a plurality of bit lines extending in a first direction; and a plurality of upper bonding pads respectively connected to the plurality of bit lines; and a peripheral circuit region comprising:

a page buffer circuit;

a plurality of bonding pad groups provided above the page buffer circuit and spaced apart from each other in a second direction; and a plurality of through-wiring lines provided above the page buffer circuit and extending in the first direction to cross the page buffer circuit from a plan view perspective, wherein the peripheral circuit region is bonded to the memory cell region, wherein each bonding pad group of the plurality of bonding pad groups comprises lower bonding pads arranged in a first line extending in the first direction, wherein the plurality of bonding pad groups and the plurality of through-wiring lines are alternately arranged, and wherein the plurality of through-wiring lines are provided below the lower bonding pads.

19. The non-volatile memory device of claim 18, wherein the page buffer circuit comprises a plurality of page buffers respectively corresponding to the plurality of bit lines, and wherein each page buffer of the plurality of page buffers comprises:

a high-voltage region comprising a high-voltage transistor connected to one of the lower bonding pads; and a low-voltage region comprising a first transistor connected to the high-voltage transistor.

20. The non-volatile memory device of claim 18, wherein the memory cell region further comprises a metal layer comprising a plurality of metal patterns each extending in the second direction, and wherein each of the plurality of bit lines are connected to a respective one of the plurality of upper bonding pads through the metal layer.

* * * * *